US008730626B2

United States Patent
Tseng et al.

(10) Patent No.: US 8,730,626 B2
(45) Date of Patent: May 20, 2014

(54) ELECTROSTATIC DISCHARGE PROTECTION

(75) Inventors: Jen-Chou Tseng, Jhudong Township (TW); Tzu-Heng Chang, New Taipei (TW); Ming-Hsiang Song, Shin-Chu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 341 days.

(21) Appl. No.: 13/252,396

(22) Filed: Oct. 4, 2011

(65) Prior Publication Data

US 2013/0083436 A1      Apr. 4, 2013

(51) Int. Cl.
*H02H 9/00* (2006.01)

(52) U.S. Cl.
USPC ............................................. 361/56; 257/355

(58) Field of Classification Search
None
See application file for complete search history.

(56) References Cited

U.S. PATENT DOCUMENTS 5,270,261 A * 12/1993 Bertin et al. .................. 438/109
5,930,098 A *  7/1999 Voldman et al. .............. 361/111
2010/0103573 A1 *  4/2010 Sasaki ............................. 361/56

* cited by examiner

*Primary Examiner* — Stephen W Jackson
*Assistant Examiner* — Terrence Willoughby
(74) *Attorney, Agent, or Firm* — Lowe Hauptman & Ham, LLP

(57) ABSTRACT

A chip includes a first circuit, a second circuit, a first interconnect, and a least one protection circuit. The first circuit has a first node, a first operational voltage node, and a first reference voltage node. The second circuit has a second node, a second operational voltage node, and a second reference voltage node. The first interconnect is configured to electrically connect the first node and the second node to form a 2.5D or a 3D integrated circuit. The at least one protection circuit is located at one or various locations of the chip.

20 Claims, 16 Drawing Sheets

US 8,730,626 B2

ELECTROSTATIC DISCHARGE PROTECTION

FIELD

The present disclosure is related to electrostatic discharge (ESD) protection for an integrated circuit (IC).

BACKGROUND

A three-dimensional integrated circuit (3D IC) refers to a 3D IC chip (or package) in which two or more dies are vertically integrated into a single chip. A 2.5D IC chip refers to a chip in which two or more dies are horizontally integrated into a single chip. Generally, each circuit of the 2.5/3D IC is a single die and comprises its own function in the conventional X- and Y-dimensions. The horizontal and vertical integration of the two distinct dies constitutes the 2.5 dimension and the third dimension.

In some approaches of 2.5D/3D IC circuits, two dies are connected through an interconnect, such as a through silicon via (TSV). When the charge distribution and thus the voltage potentials between the two dies are not balanced, a current is created and flows between the two dies potentially damaging the dies. An ESD event generally results in a very high voltage and causes a charge imbalance. As a result, an ESD current resulting from an ESD event may find a path to flow from the operational voltage node of a first die to the reference voltage node of the second die, for example. Some transistors in the first and/or the second die may accidentally be part of the current path. Consequently, the gate oxide of the transistors may be destroyed by the ESD current.

BRIEF DESCRIPTION OF THE DRAWINGS

The details of one or more embodiments of the disclosure are set forth in the accompanying drawings and the description below. Other features and advantages will be apparent from the description, drawings, and claims.

Like reference symbols in the various drawings indicate like elements.

DETAILED DESCRIPTION

Figure 1:
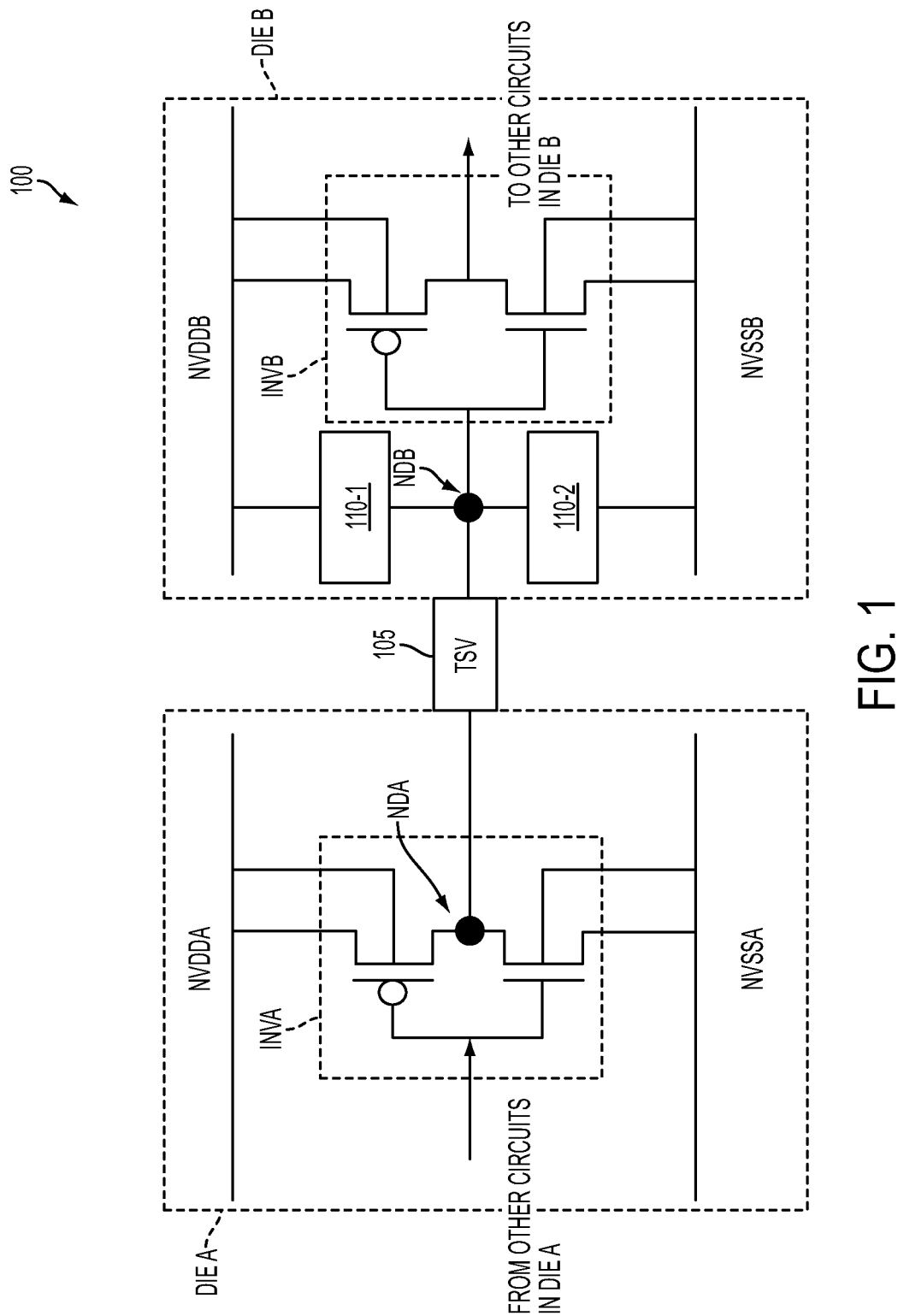
FIG. 1 is diagram of a 3D IC having ESD protection circuits in some locations, in accordance with some embodiments.

Embodiments, or examples, illustrated in the drawings are disclosed below using specific language. It will nevertheless be understood that the embodiments and examples are not intended to be limiting. Any alterations and modifications in the disclosed embodiments, and any further applications of the principles disclosed in this document are contemplated as would normally occur to one of ordinary skill in the pertinent art.

Some embodiments have one or a combination of the following features and/or advantages. ESD protection circuits are used at different locations of two dies in a 2.5D/3D IC chip. Different devices are implemented as the protection circuits, in some embodiments. Exemplary devices include diodes, P and/or N type metal oxide semiconductor (MOS) transistors, silicon controlled rectifiers (SRC), field oxide device (FOD), bipolar junction transistors (BJTs), gate grounded MOS (GGNMOS) transistors, gate and VDD coupled MOS (GDPMOS) transistors, gate-coupled transistors, substrate-triggered transistors, dynamic floating transistors, or other devices. In some embodiments, the ESD protection circuits are formed before the through silicon via (TSV). The ESD protection circuits are configured to provide discharge or current paths for the ESD current to flow. As a result, the large ESD current does not flow through other transistors in the circuits. The ESD protection circuits provide a voltage and current clamp at various odes, in some embodiments. Consequently, the transistors coupled to the nodes are prevented from being subjected to a large voltage and/or a large current. The transistors are therefore protected.

Exemplary Circuits

Various embodiments are explained below in the context of exemplary die A and die B integrated into a single chip. The chip is manufactured by a 2.5D IC or a 3D IC process that integrates two individual dies, a first individual die and a second individual die on a wafer, and two dies on two separate wafers. The 2.5D process integrates two dies in the horizontal direction while the 3D process integrates two dies in the vertical direction. For simplicity, various embodiments are explained in the context of a 3D IC chip. The inventive concept, however, is applicable to a 2.5D IC chip. In some embodiments, a 2.5D/3D IC chip is a system on chip (SOC) having different circuit functions in die A and die B integrated into a single chip.

Figure 6:
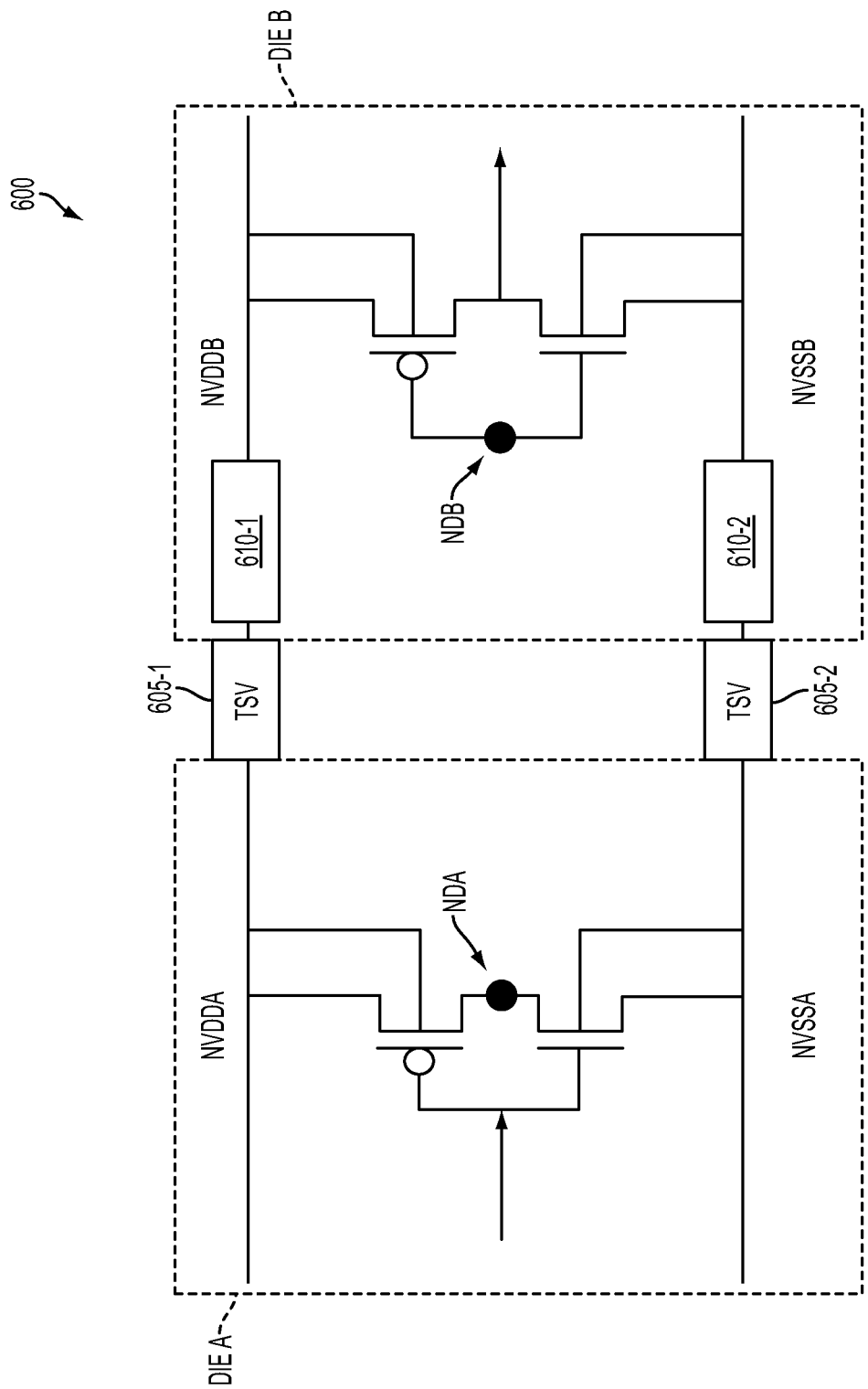
FIG. 6 is a diagram of a circuit having ESD protection circuits in locations differing from the circuit in FIG. 1, in accordance with some embodiments.
Figure 11:
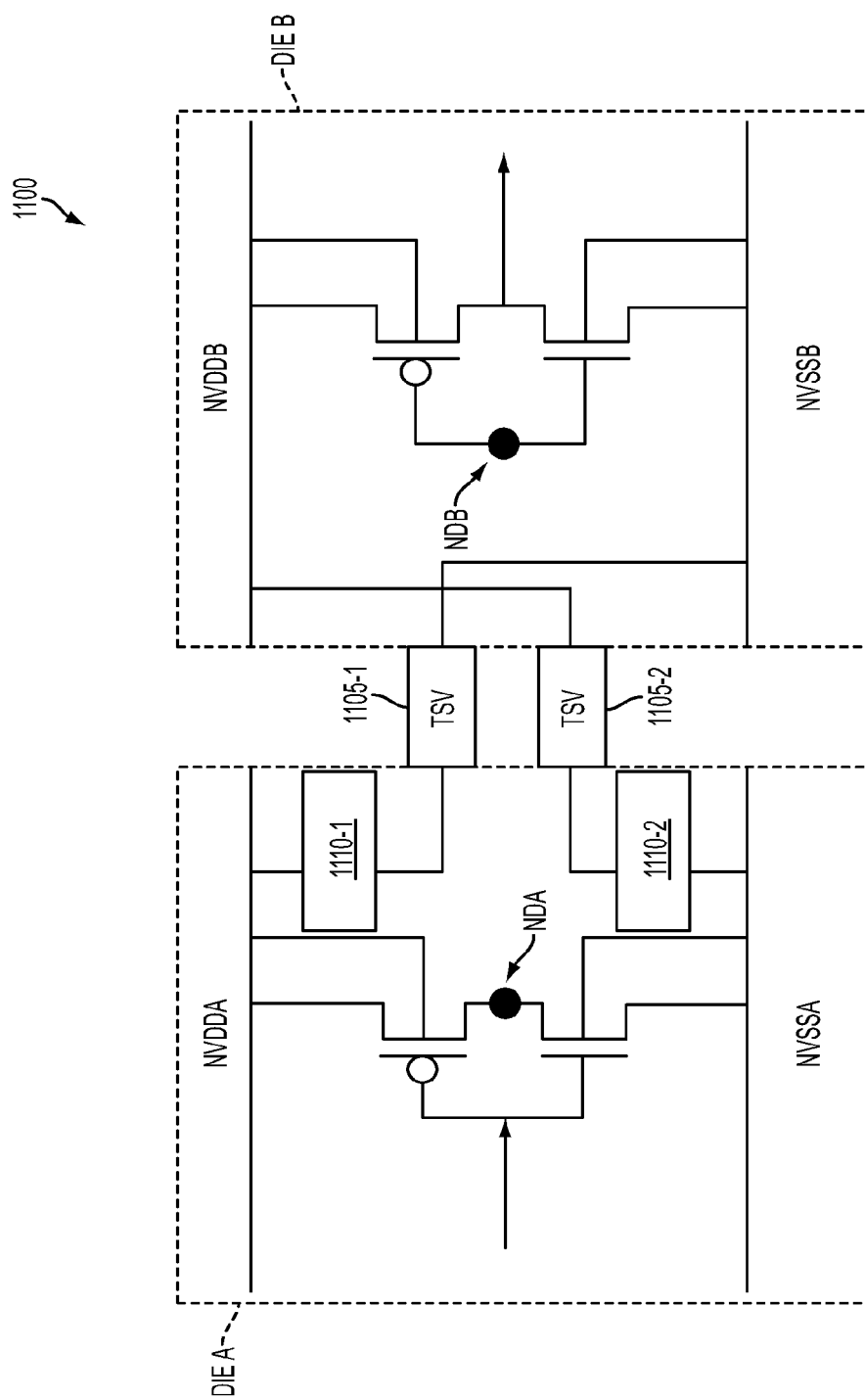
FIG. 11 is a diagram of a circuit having ESD protection circuits in locations differing from the circuit in FIG. 1 and FIG. 6, in accordance with some embodiments.

In the below FIGS. 1, 6, and 11, the protection circuits shown in specific locations are for illustration. A chip having one or a combination of protection circuits at different locations explained in FIGS. 1, 6, and 11 is within the scope of various embodiments. In some embodiments, protection circuits are embedded in the corresponding die before the TVS is formed.

FIG. 1 is a diagram of a 3D IC chip 100, in accordance with some embodiments. Operational voltage node NVDDA in die A has voltage VDDA (not labeled), and operational voltage node NVDDB in die B has voltage VDDB (not labeled). Similarly, reference voltage node NVSSA has voltage VSSA (not labeled) and reference voltage node NVSSB has VSSB (not labeled).

Each of die A and die B has its own circuitry function. Die A comprises an inverter INVA and die B comprises an inverter INVB for illustration. Input of inverter INVA receives signals from other circuits in die A. Output node NDA of inverter A is electrically coupled to input node NDB of inverter INVB by way of a 3D IC connect, such as a through silicon via (TSV) 105. Output of inverter INVB is provided to other circuits in die B. In some embodiments, TSV 105 is formed by a metal layer.

The output of inverter INVB is the result of the input from other circuits in die A passing through two inverters INVA and INVB. As a result, the input of inverter INVA and the output of inverter INVB are electrically the same. Explained in another way, the signals of circuits in die A are transferred to die B.

ESD clamp or protection circuits 110-1 and 110-2 provide current paths for the ESD current to flow when an ESD event occurs. Circuits 110-1 and 110-2 also provide a clamp voltage and a clamp current at node NDB. For illustration, circuit 110-1 is shown coupled between node NDB and node NVDDB of die B. Circuit 110-1 coupled between node NDA and node NVDDA of die A is within the scope of various embodiments. Similarly, circuit 110-2 is shown coupled between node NDB and node NVSSB for illustration. Circuit 110-2 coupled between node NDA and node NVSSA of die A is within the scope of various embodiments. Further, both circuits 110-1 and 110-2 are shown for illustration. One or a combination of circuits 110-1 and 110-2 at different locations is within the scope of various embodiments.

Figure 2:
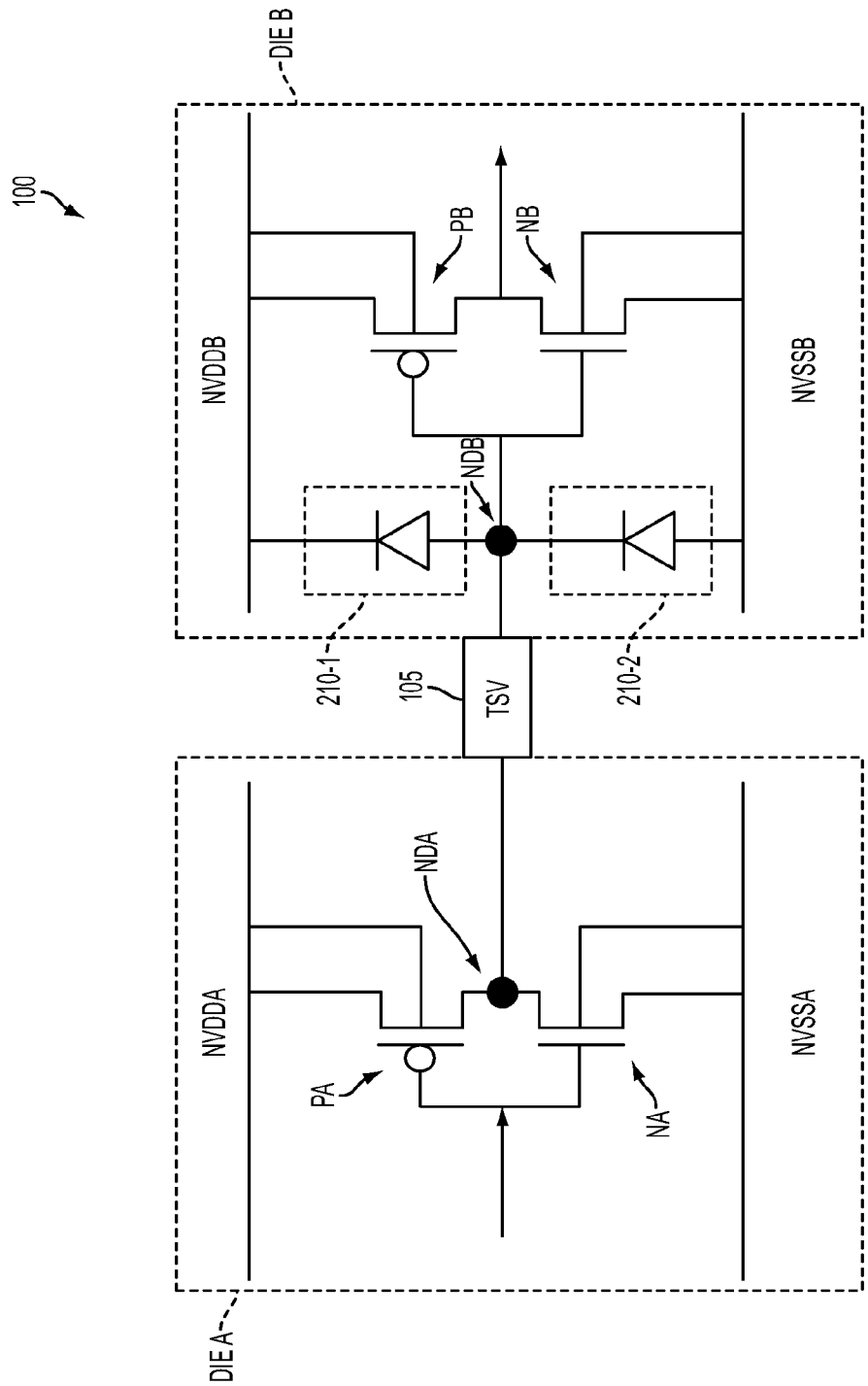
FIG. 2 is a diagram of the circuit in FIG. 1 in which the protection circuits are implemented as diodes, in accordance with some embodiments.

FIG. 2 is a diagram of chip 100 in which circuits 110-1 and 110-2 are implemented by a diode 210-1 and a diode 210-2, respectively. For simplicity, various details of die A and die B are not labeled.

The anode of diode 210-1 is coupled to node NDB while the cathode of diode 210-1 is coupled to node NVDDB. When an ESD event occurs, for example, the ESD current has a path to flow from node NDB through diode 210-1 to node NVDDB. In some embodiments, the ESD current also flows from node NVDDB to node NVSSB through another protection circuit (not shown) between node NVDDB and NVSSB. Similarly, if diode 210-1 is located between node NDA and node NVDDA, the ESD current has a path to flow from node NDB through TSV 105, node NDA, and diode 210-1 to node NVDDA. In some embodiments, the ESD current also flows from node NVDDA to node NVSSA through another protection circuit (not show) between node NVDDA and node NVSSA.

The anode of diode 210-2 is coupled to node NVSSB, and the cathode of diode 210-2 is coupled to node NDB. As a result, when an ESD event occurs, the ESD current has a path to flow from node NVSSB to node NDB. Without diode 210-2, the ESD current may flow from the source to the gate of transistor NB (or node NDB), and damage transistor NB. If diode 210-2 is coupled between node NVSSA and node NDA, the ESD current has a path to flow from node NVSSA and node NDA.

Figure 3:
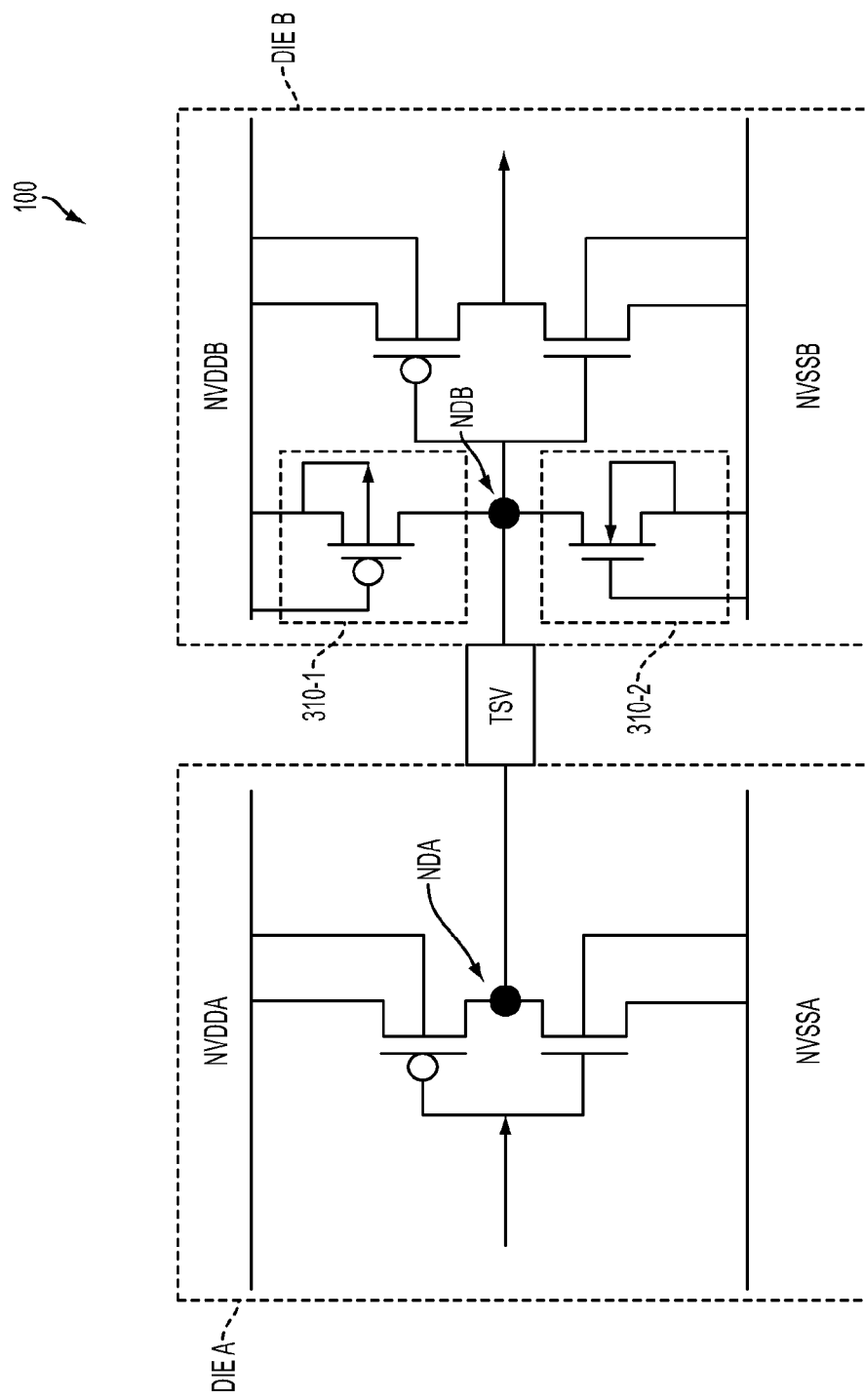
FIG. 3 is a diagram of the circuit in FIG. 1 in which the protection circuits are implemented as metal oxide semiconductor (MOS) transistors, in accordance with some embodiments.

FIG. 3 is a diagram of chip 100 in which circuits 110-1 and 110-2 are implemented by a PMOS transistor 310-1 and an NMOS transistor 310-2, respectively. Transistor 310-1 provides a first current path from node NDB to node NVDDB and a second current path from node NVDDB to node NDB.

PMOS transistor 310-1 is configured as a diode because the source and the gate of PMOS transistor 310-1 are coupled together (and coupled to node NVDDB). As a result, the function of PMOS transistor 310-1 is similar to that of diode 210-1 in FIG. 2. That is, transistor 310-1 provides a first current path from node NDB through transistor 310-1 to node NVDDB by functioning as a diode. In addition, by nature of a PMOS transistor, transistor 310-1 also provides a second current path from the source NVDDB to the drain NDB of transistor 310-1.

Similarly, NMOS transistor 310-2 is configured as a diode because the gate and the source of transistor 310-2 are coupled together (and to node NVSSB). As a result, the function of NMOS transistor 310-2 is similar to that of diode 210-2. Transistor 310-2 thus provides a first current path from node NVSSB through transistor 310-2 to node NVDDB. In addition, transistor 310-2, by nature of an NMOS transistor, also provides a second current path from node NDB through transistor 310-2 to node NVSSB.

Figure 4:
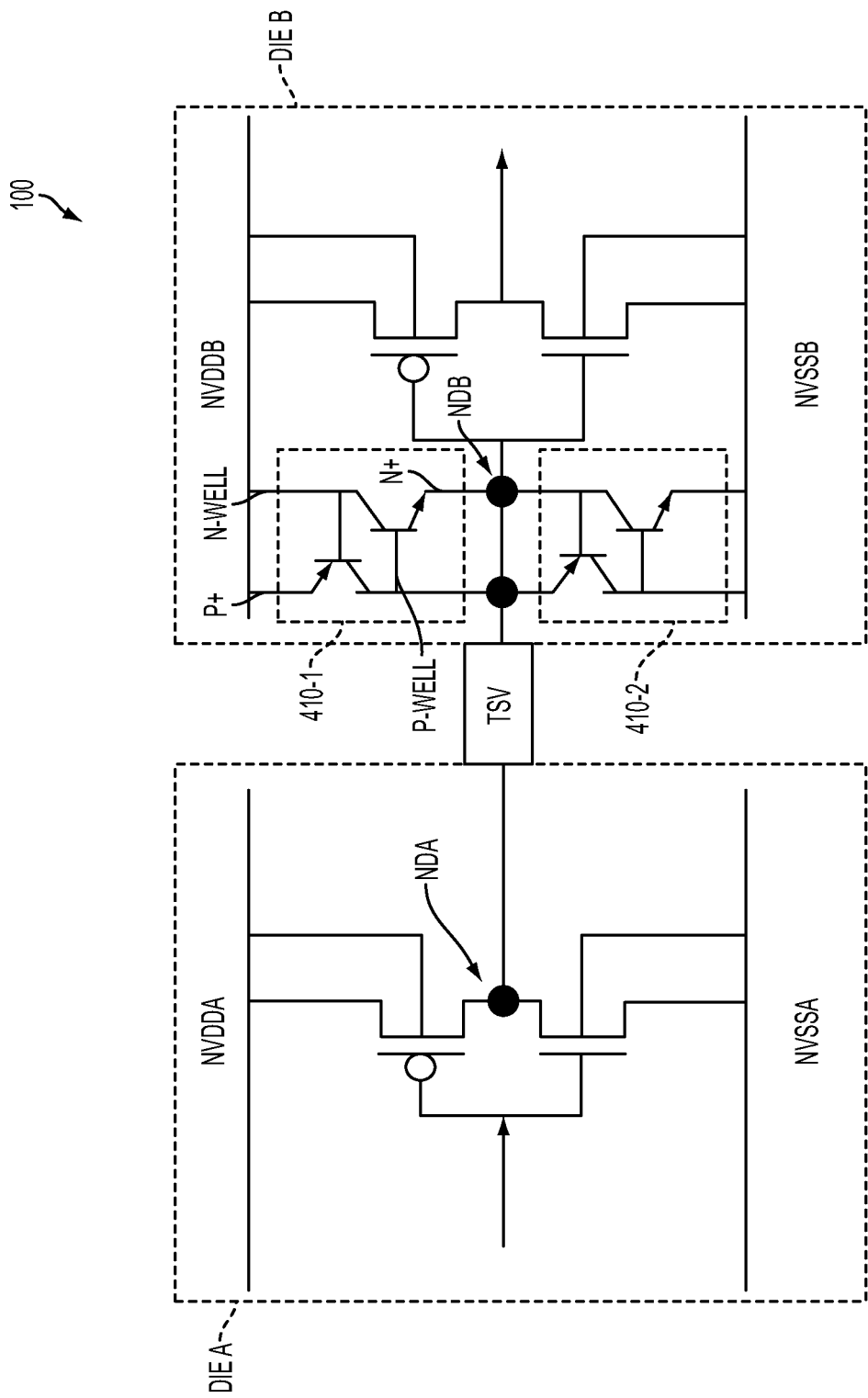
FIG. 4 is a diagram of the circuit in FIG. 1 in which the protection circuits are implemented as silicon control rectifiers (SCRs), in accordance with some embodiments.

FIG. 4 is a diagram of chip 100 in which circuits 110-1 and 110-2 are implemented by silicon control rectifiers (SCRs) 410-1 and 410-2, respectively. In some embodiments, an SCR includes a P+ region, an N-well, a P-well, an N+ region as illustratively shown for SCR 410-1 in FIG. 4. For simplicity, the P+ region, the N-well, the P-well, and the N+ region of SCR 410-2 are not labeled, but should be recognizable by persons of ordinary skill in the art. An SCR allows current to flow through the SCR in both directions. For example, SCR 410-1 provides a first current path from node NDB to node NVDDB through the P-well and the N-well. SCR 410-1 also provides a second current path from node NVDDB to node NDB through the P+ and N+ regions.

Similarly, SCR 410-2 provides a first current path from node NVSSB to node NDB through the P-well and N-well of SCR 410-2. SCR 410-2 also provides a second current path from node NDB to node NVSSB through the P+ and N+ regions of SCR 410-2.

Figure 5:
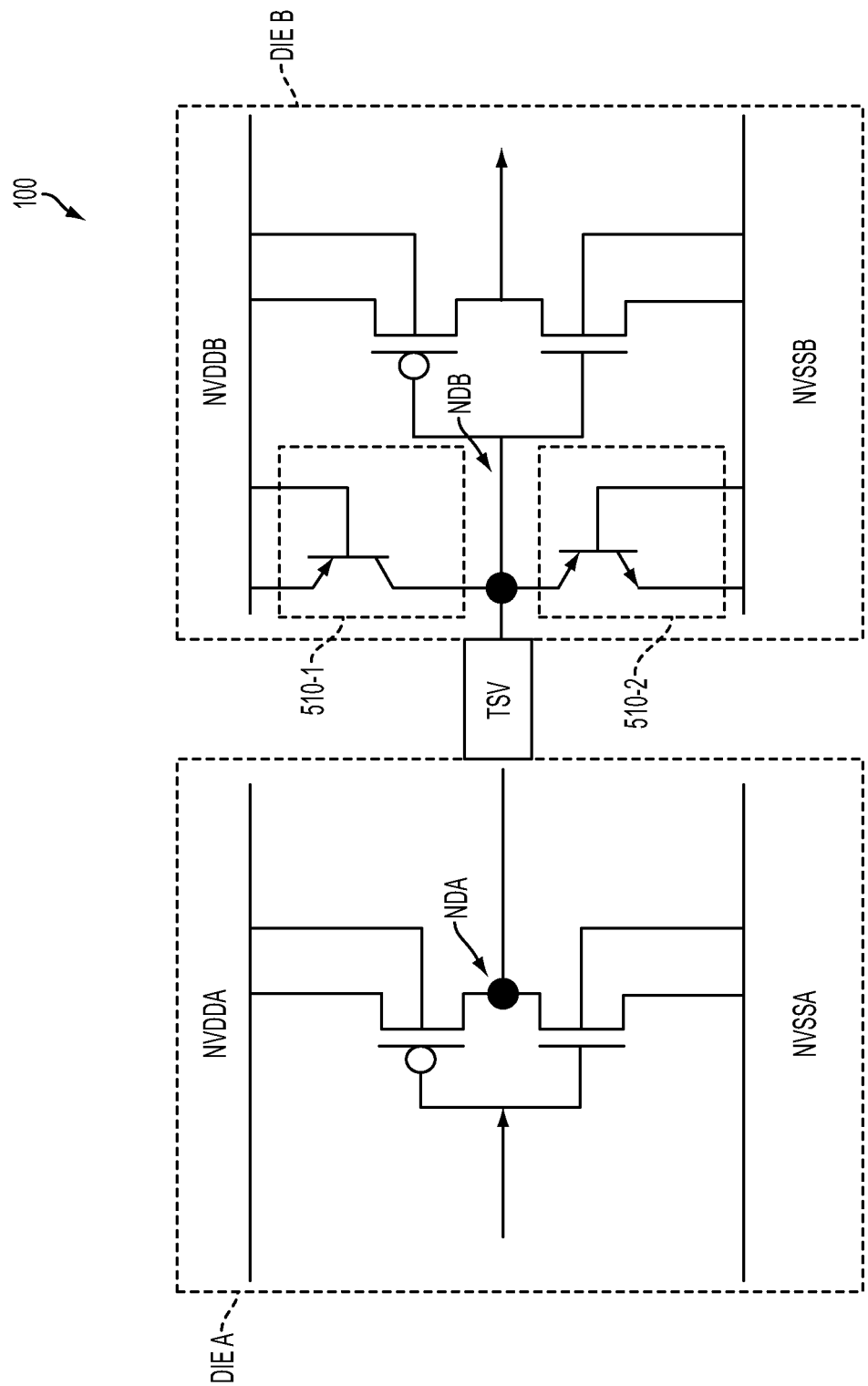
FIG. 5 is a diagram of the circuit in FIG. 1 in which the protection circuits are implemented as bipolar junction transistors (BJTs), in accordance with some embodiments.

FIG. 5 is a diagram of chip 100 in which circuits 110-1 and 110-2 are implemented by bipolar junction transistors (BJTs) 510-1 and 510-2, respectively.

The emitter and the base of PNP transistor 510-1 are coupled together and to node NVDDB. The collector of transistor 510-1 is coupled to node NDB. Transistor 510-1 provides a first current path from node NVDDB to node NDB through the normal function of a PNP transistor. For example, the current flows through the emitter at node NVDDB to the collector at node NDB. Transistor 510-2 also provides a second current path from node NDB to node NVDDB by functioning as a diode formed by the P+ region at the collector or node NDB, and the N-well of the base coupled to node VNDDB.

The emitter and the base of transistor 510-2 are coupled together and to node NVSSB. The collector of transistor 510-2 is coupled to node NDB. Transistor 510-2 provides a first current path from node NDB to node NVSSB through the normal function of an NPN transistor. For example, the current flows through the collector at node NDB to the emitter at node NVSSB. Transistor 510-2 also provides a second current path from node NVSSB to node NDB. In this second situation, transistor 510-2 functions as a diode formed by the P-well of the base at node NVSSB and the N region at the collector coupled to node NDB.

FIG. 6 is a diagram of a 3D IC chip 600, in accordance with some embodiments. ESD protection circuit 610-1 and a first TSV 605-1 are coupled between operational voltage nodes NVDDA and NVDDB. Circuit 610-1 as shown in die B between TSV 605-1 and node NVDDB is for illustration. Circuit 610-1 in die A between node NVDDA and TSV 605-1 is within the scope of various embodiments.

Similarly, circuit 610-2 and a second TSV 605-2 are coupled between reference voltage nodes NVSSA and NVSSB. Circuit 610-2 as shown in die B between TSV 605-2 and node NVSSB is for illustration. Circuit 610-2 in die A between node NVSSA and TSV 605-2 is within the scope of various embodiments.

Figure 7:
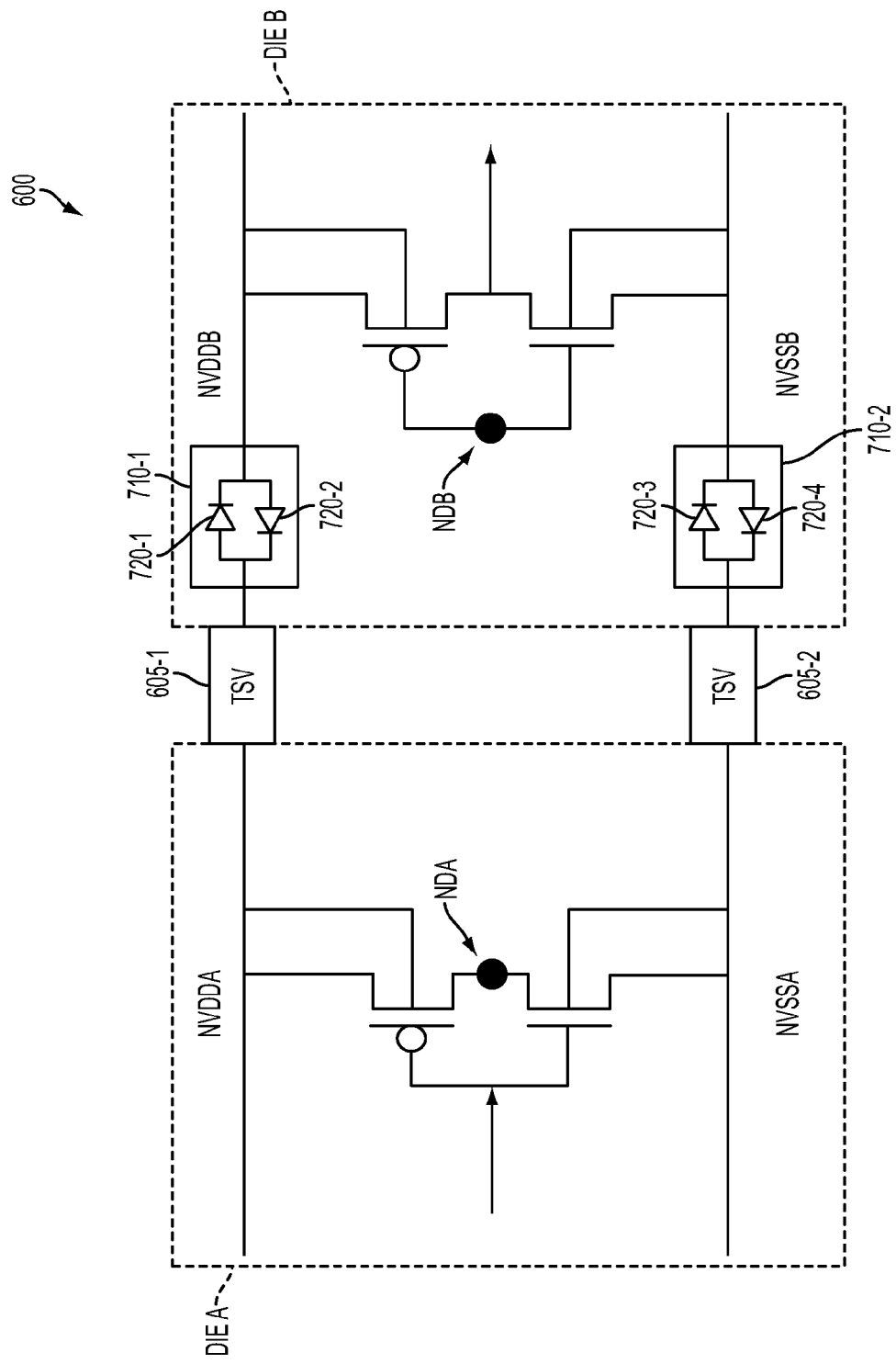
FIG. 7 is a diagram of the circuit in FIG. 6 in which the protection circuits are implemented as pairs of diodes, in accordance with some embodiments.

FIG. 7 is a diagram of chip 600 in which each circuit 610-1 and 610-2 is implemented with a pair of diodes in circuits 710-1 and 710-2, respectively, in accordance with some embodiments. Circuit 710-1 provides a first current path from node NVDDA by way of TSV 605-1 and diode 720-1 to node NVDDB. Circuit 710-1 also provides a second current path from node NVDDB, diode 720-2, and TSV 605-1 to node NVDDA.

Circuit 710-2 provides a first current path from node NVSSA, TSV 605-2, and diode 720-3 to node NVSSB. Circuit 710-2 also provides a second current path from node NVSSB, diode 720-4, and TSV 605-2 to node NVSSA.

Figure 8:
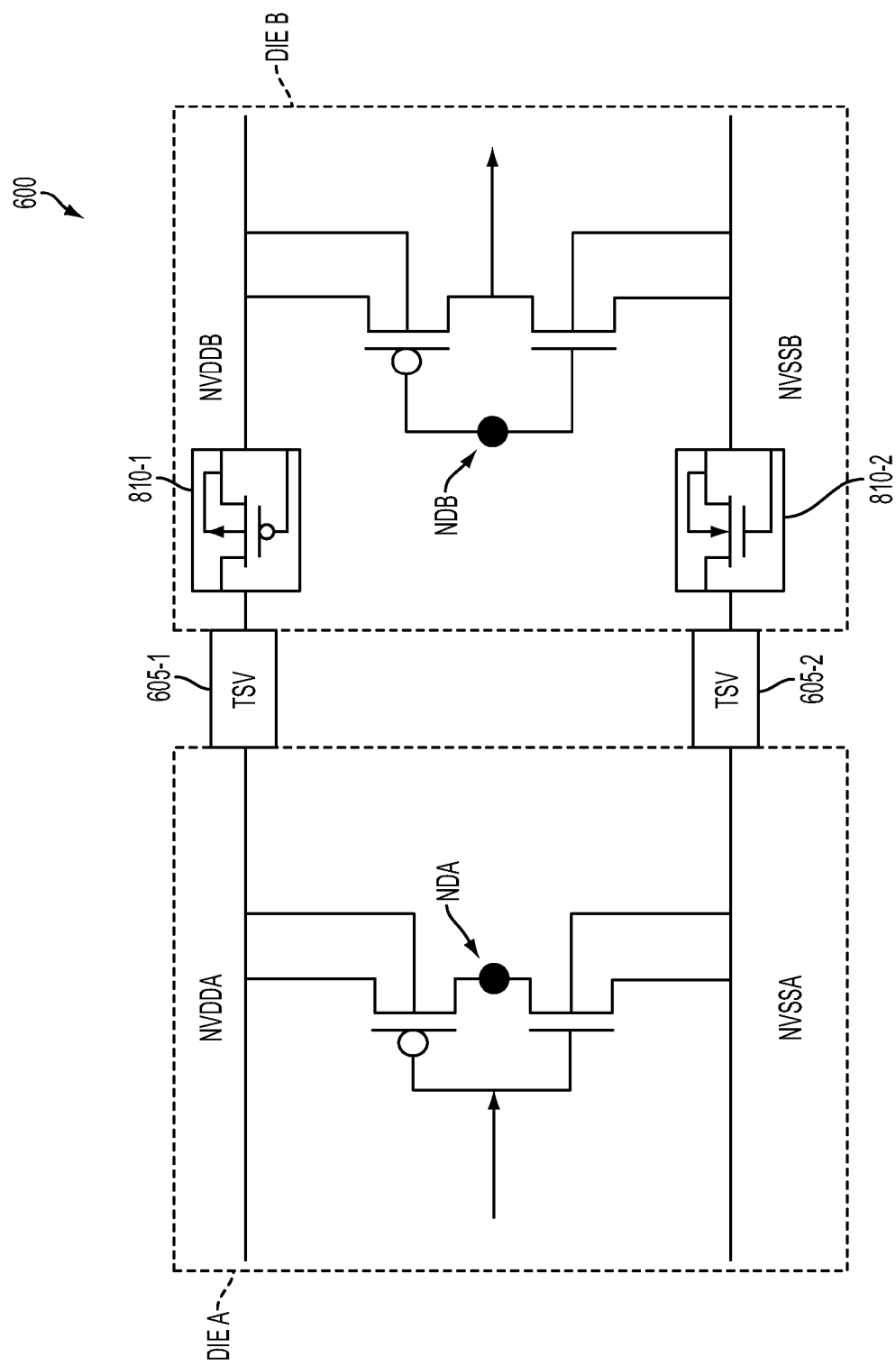
FIG. 8 is a diagram of the circuit in FIG. 6 in which the protection circuits are implemented as MOS transistors, in accordance with some embodiments.

FIG. 8 is a diagram of chip 600 in which circuits 610-1 and 610-2 are implemented with a PMOS transistor 810-1 and an NMOS transistor 810-2, respectively, in accordance with some embodiments. Each of PMOS transistor 810-1 and NMOS transistor 810-2 provides two current paths in opposite directions similar to PMOS transistor 310-1 and NMOS transistor 310-2 in FIG. 3, respectively. In other words, PMOS transistor 810-1 provides a first current path from node NVDDA, TSV 605-1, and transistor 810-1 to node NVDDB. PMOS transistor 810-1 also provides a second current path from node NVDDB, transistor 810-1, and TSV 605-1 to node NVDDA. Similarly, NMOS transistor 810-2 provides a first current path from node NVSSA, TSV 605-2, and transistor 810-2 to node NVSSB. PMOS transistor 810-2 also provides a second current path from node NVSSB, transistor 810-2, and TSV 605-2 to node NVSSA.

Figure 9:
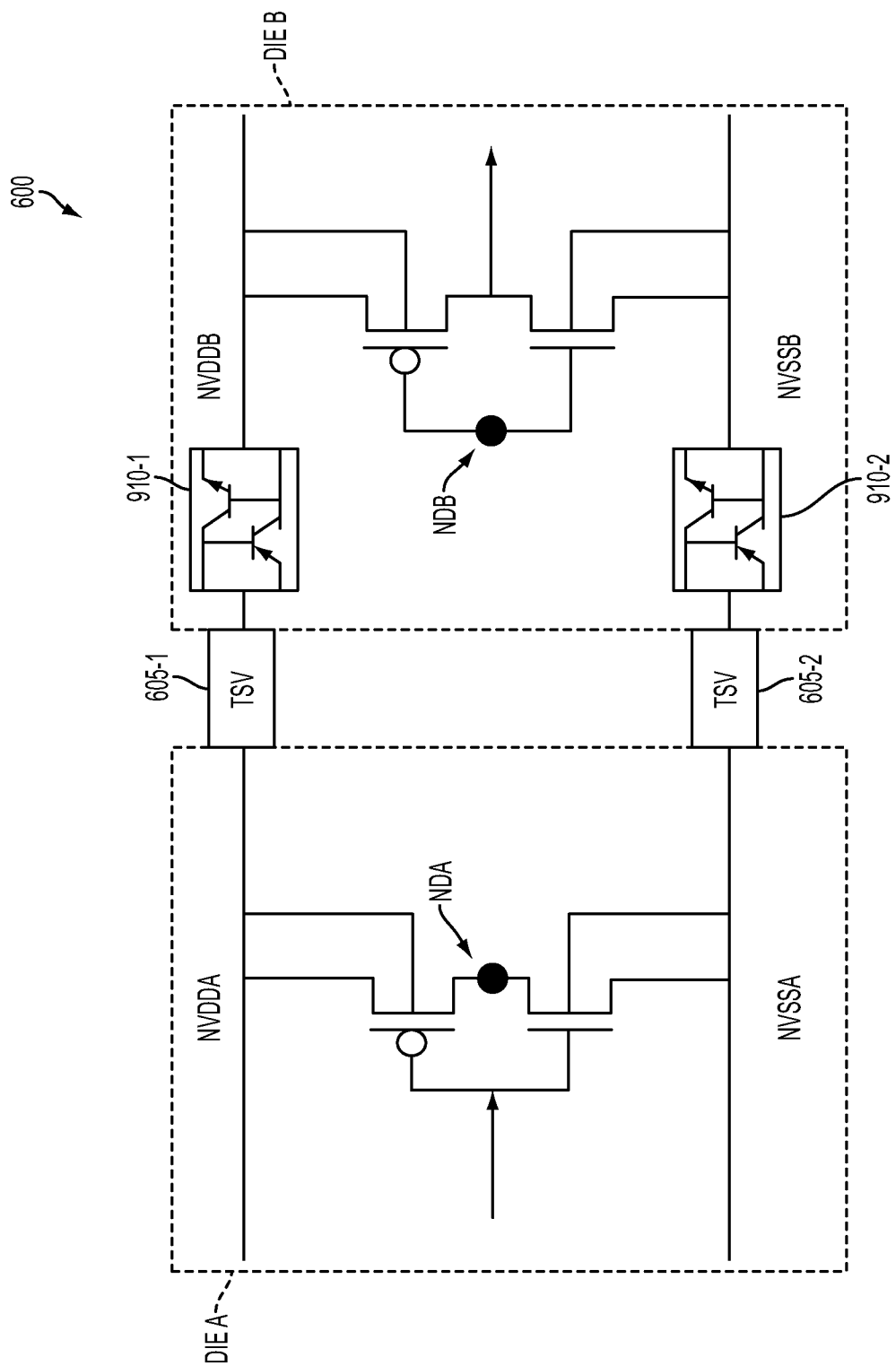
FIG. 9 is a diagram of the circuit in FIG. 6 in which the protection circuits are implemented as SCRs, in accordance with some embodiments.

FIG. 9 is a diagram of chip 600 in which circuits 610-1 and 610-2 are implemented with SCRs 910-1 and 910-2, respectively, in accordance with some embodiments. Each of SCR 910-1 and SCR 910-2 provides two current paths in opposite directions similar to SCR 410-1 and SCR 410-2 in FIG. 4, respectively. In other words, SCR 910-1 provides a first current path from node NVDDA, TSV 605-1, and SCR 910-1 to node NVDDB. SCR 910-1 also provides a second current path from node NVDDB, transistor 910-1, and TSV 605-1 to node NVDDA. Similarly, SCR 910-2 provides a first current path from node NVSSA, TSV 605-2, and SCR 910-2 to node NVSSB. SCR 910-2 also provides a second current path from node NVSSB, SCR 910-2, and TSV 605-2 to node NVSSA.

Figure 10:
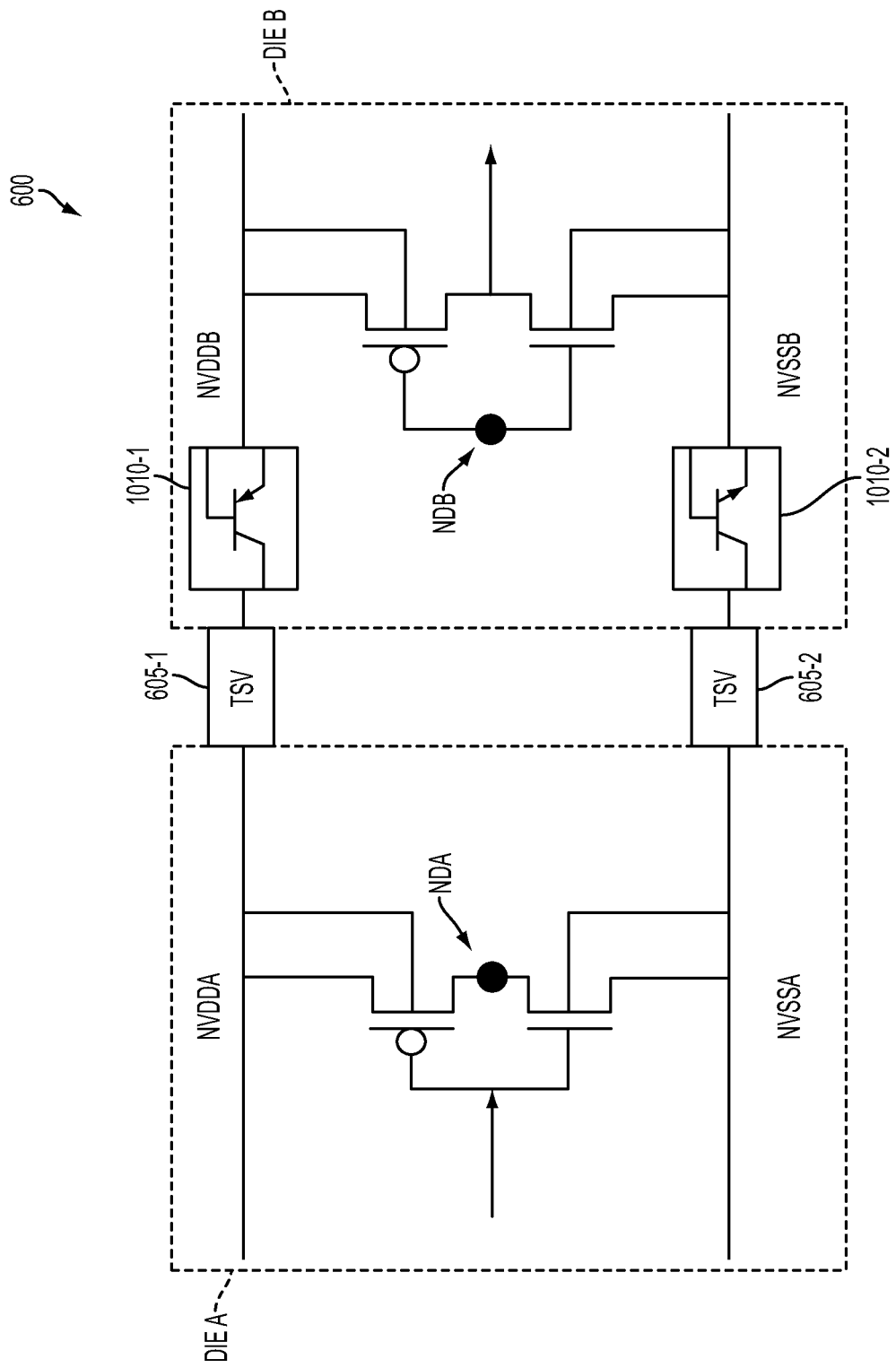
FIG. 10 is a diagram of the circuit in FIG. 6 in which the protection circuits are implemented as BJTs, in accordance with some embodiments.

FIG. 10 is a diagram of chip 600 in which circuits 610-1 and 610-2 are implemented with BJTs 1010-1 and 1010-2, respectively, in accordance with some embodiments. Each of BJT 1010-1 and BJT 1010-2 provides two current paths in opposite directions similar to BJT 510-1 and BJT 510-2 in FIG. 5, respectively. In other words, BJT 1010-1 provides a first current path from node NVDDA, TSV 605-1, and BJT 1010-1 to node NVDDB. BJT 1010-1 also provides a second current path from node NVDDB, BJT 1010-1, and TSV 605-1 to node NVDDA. Similarly, BJT 1010-2 provides a first current path from node NVSSA, TSV 605-2, and BJT 1010-2 to node NVSSB. BJT 1010-2 also provides a second current path from node NVSSB, BJT 1010-2, and TSV 605-2 to node NVSSA.

FIG. 11 is a diagram of a 3D IC chip 1100, in accordance with some embodiments. In some embodiments, ESD protection circuit 1110-1 and a first TSV 1105-1 are coupled between operational voltage node NVDDA of die A and reference voltage node NVSSB of die B. Circuit 1110-1 shown in die A between node NVDDA and TSV 1105-1 is for illustration. Circuit 1110-1 in die B between TSV 1105-1 and node NVSSB is within the scope of various embodiments.

Similarly, in some embodiments, circuit 1110-2 and a second TSV 1105-2 are coupled between reference voltage node NVSSA and operational voltage node NVDDB. Circuit 1110-2 shown in die A between NVSSA and TSV 1105-2 is for illustration. Circuit 1110-2 in die B between TSV 1105-2 and node NVDDB is within the scope of various embodiments.

Figure 12:
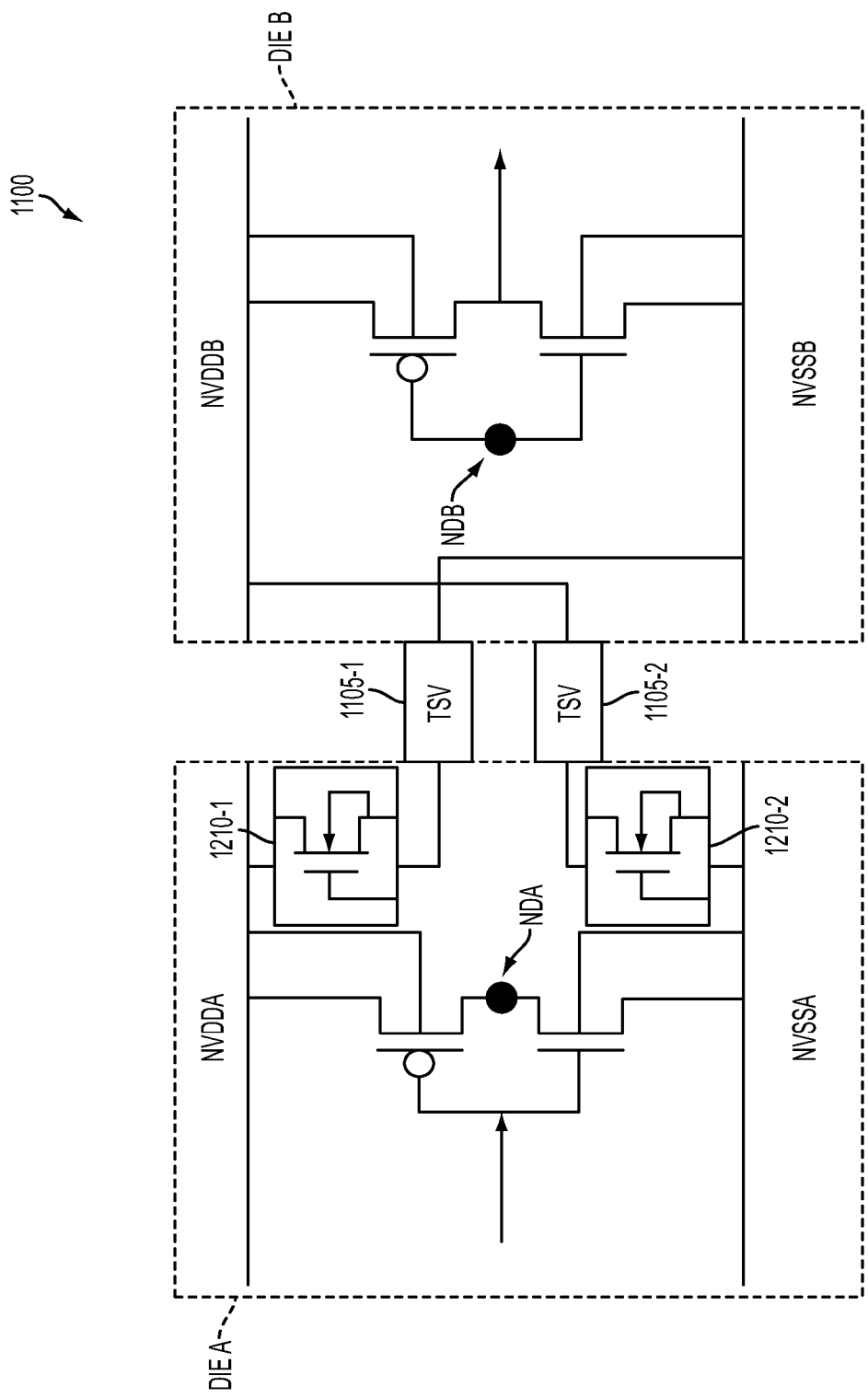
FIG. 12 is a diagram of the circuit in FIG. 11 having protection circuits implemented as N-type metal oxide semiconductor (NMOS) transistors, in accordance with some embodiments.

FIG. 12 is a diagram of chip 1100 in which circuits 1110-1 and 1110-2 are implemented with NMOS transistors 1210-1 and 1210-2, respectively, in accordance with some embodiments.

Each of transistor 1210-1 and transistor 1210-2 provides two current paths in opposite directions similar to NMOS transistor 310-2 in FIG. 3. In other words, NMOS transistor 1210-1 provides a first current path from node NVDDA, transistor 1210-1, and TSV 1105-1 to node NVSSB. Transistor 1210-1 also provides a second current path from node NVSSB, TSV 1105-1, and transistor 1210-1 to node NVDDA.

Similarly, NMOS transistor 1210-2 provides a first current path from node NVSSA, transistor 1210-2, and TSV 1105-2 to node NVDDB. Transistor 1210-2 also provides a second current path from node NVDDB, TSV 1105-2, and transistor 1210-2 to node NVSSA.

Figure 13:
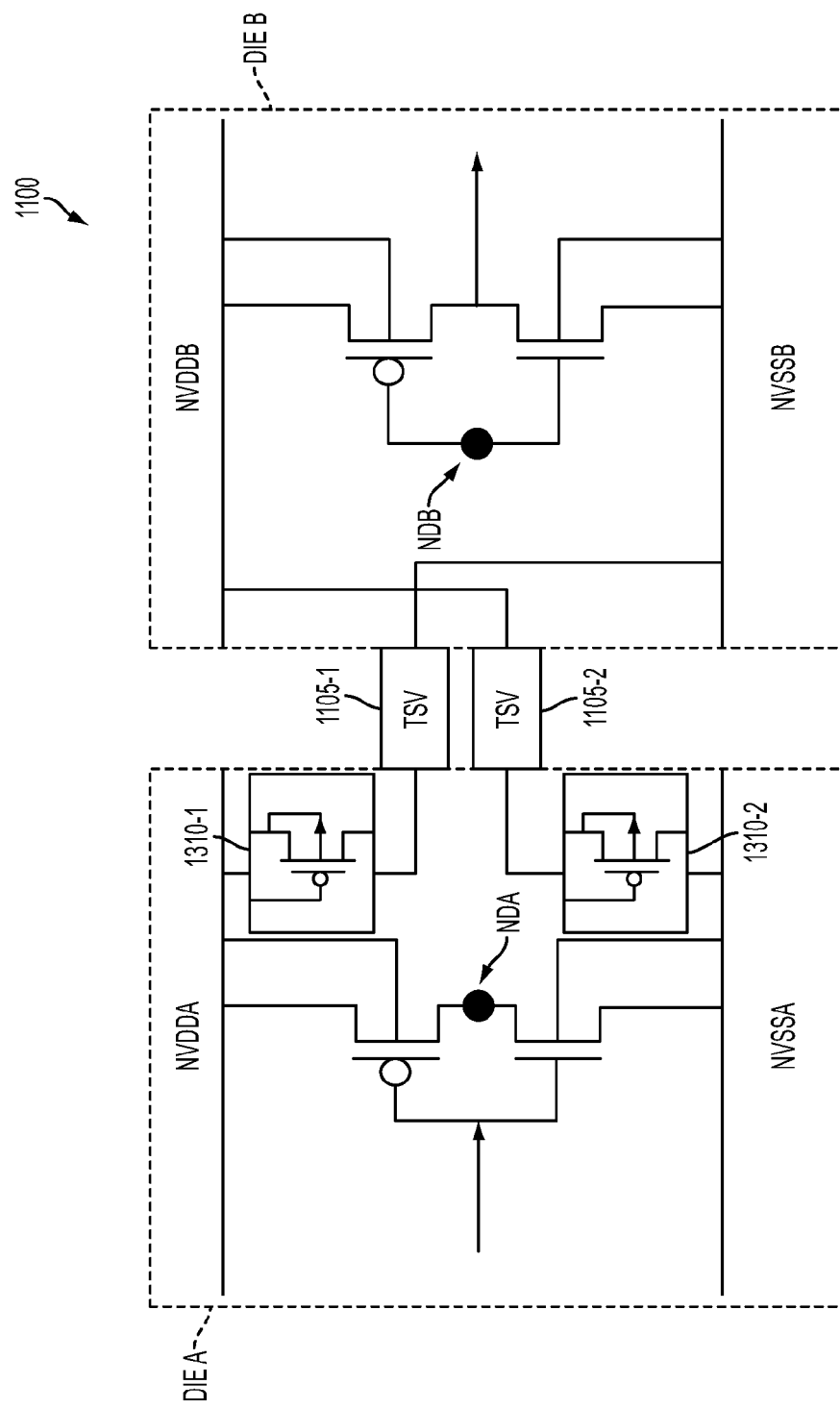
FIG. 13 is a diagram of the circuit in FIG. 11 having protection circuits implemented as P-type metal oxide semiconductor (PMOS) transistors, in accordance with some embodiments.

FIG. 13 is a diagram of chip 1100 in which circuits 1110-1 and 1110-2 are implemented with PMOS transistors 1310-1 and 1310-2, respectively, in accordance with some embodiments.

Each of PMOS transistor 1310-1 and PMOS transistor 1310-2 provides two current paths in opposite directions similar to PMOS transistor 310-1 in FIG. 3. In other words, PMOS transistor 1310-1 provides a first current path from node NVDDA, transistor 1310-1, and TSV 1105-1 to node NVSSB. Transistor 1310-1 also provides a second current path from node NVSSB, TSV 1105-1, and transistor 1310-1 to node NVDDA.

Similarly, PMOS transistor 1310-2 provides a first current path from node NVSSA, transistor 1310-2, and TSV 1105-2 to node NVDDB. Transistor 1310-2 also provides a second current path from node NVDDB, TSV 1105-2, and transistor 1310-2 to node NVSSA.

Figure 14:
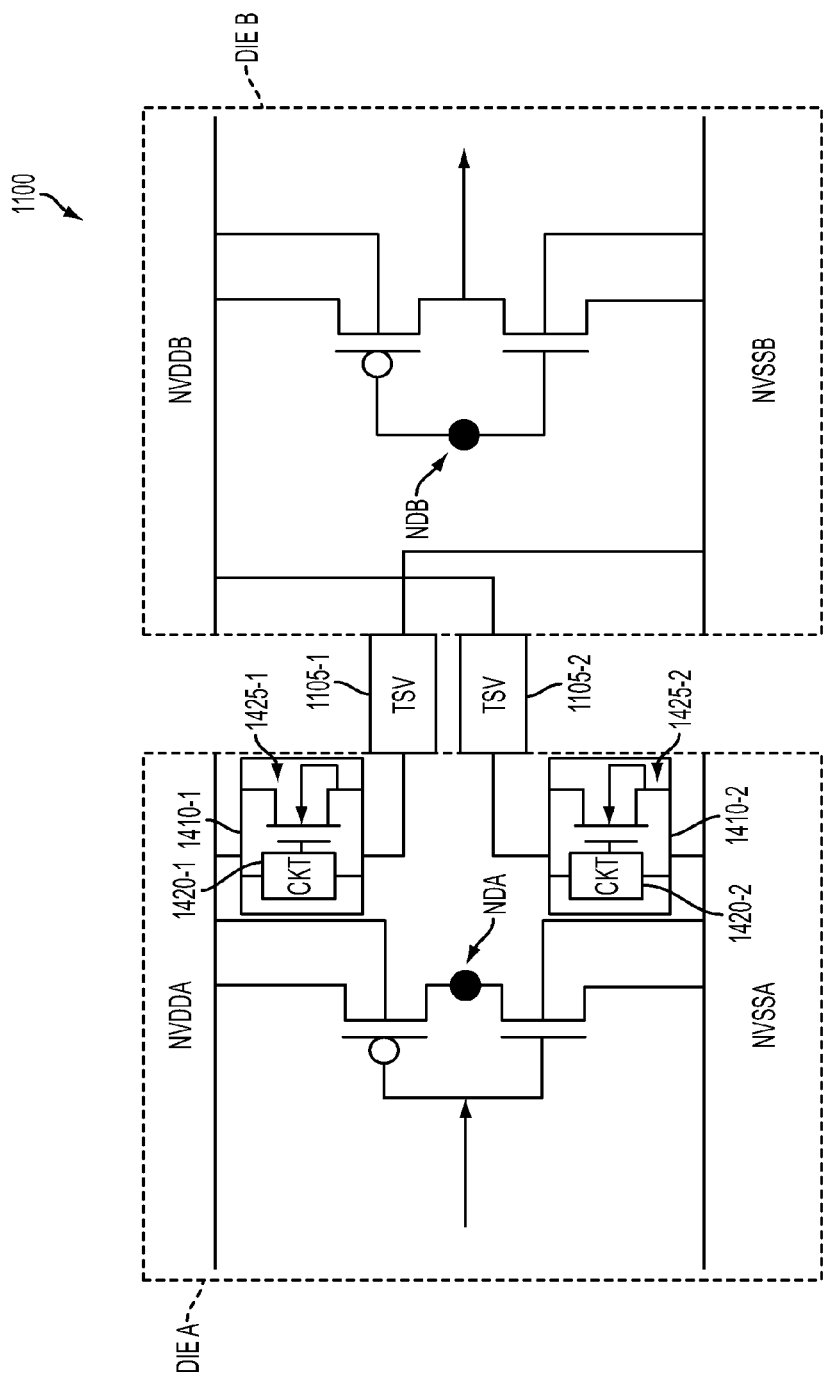
FIG. 14 is a diagram of the circuit in FIG. 11 having protection circuits implemented as NMOS transistors with a control circuit, in accordance with some embodiments.

FIG. 14 is a diagram of chip 1100 in which circuits 1110-1 and 1110-2 are implemented with circuits 1410-1 and 1410-2, respectively, in accordance with some embodiments.

Circuit 1410-1 includes an NMOS transistor 1425-1 having a gate coupled to control circuit 1420-1 to turn on and off transistor 1425-1. Because of the gate-coupled configuration, transistor 1425-1 is commonly called a gate-coupled transistor.

When transistor 1425-1 is off, transistor 1425-1 is electrically disconnected from node NVDDA. As a result, there is no leakage through transistor 1425-1. When transistor 1425-1 is on, however, transistor 1425-1 functions in a manner similar to NMOS transistor 1210-1. That is, NMOS transistor 1425-1 provides a first current path from node NVDDA, transistor 1425-1, and TSV 1105-1 to node NVSSB. Transistor 1425-1 also provides a second current path from node NVSSB, TSV 1105-1, and transistor 1425-1 to node NVDDA.

In various embodiments, in a normal operation of chip 1100, control circuit 1420-1 is configured to turn off transistor 1425-1. When an ESD event occurs, the ESD current and/or ESD voltage causes control circuit 1420-1 to turn on transistor 1425-1. In some embodiments, control circuit 1420-1 includes mechanisms known in the art to turn on and off transistor 1425-1 based on an ESD event. The mechanisms are not described in this document, but should be recognizable by persons of ordinary skill in the art.

Circuit 1410-2 includes an NMOS transistor 1425-2 having a gate coupled to control circuit 1420-2 to turn on and off transistor 1425-2. Because of the gate-coupled configuration, transistor 1425-2 is commonly called a gate-coupled transistor.

When transistor 1425-2 is off, transistor 1425-2 is electrically disconnected from node NVSSA. As a result, there is no leakage through transistor 1425-2. When transistor 1425-2 is on, however, transistor 1425-2 functions in a manner similar to NMOS transistor 1210-2. That is, NMOS transistor 1425-2 provides a first current path from node NVSSA, transistor 1425-2, and TSV 1105-2 to node NVDDB. Transistor 1425-2 also provides a second current path from node NVDDB, TSV 1105-2, and transistor 1425-2 to node NVSSA.

In various embodiments, in a normal operation of chip 1100, control circuit 1420-2 is configured to turn off transistor 1425-2. When an ESD event occurs, the ESD current and/or ESD voltage causes control circuit 1420-2 to turn on transistor 1425-2. In some embodiments, control circuit 1420-2 includes mechanisms known in the art to turn on and off transistor 1425-2 based on an ESD event. The mechanisms are not described in this document, but should be recognizable by persons of ordinary skill in the art.

Figure 15:
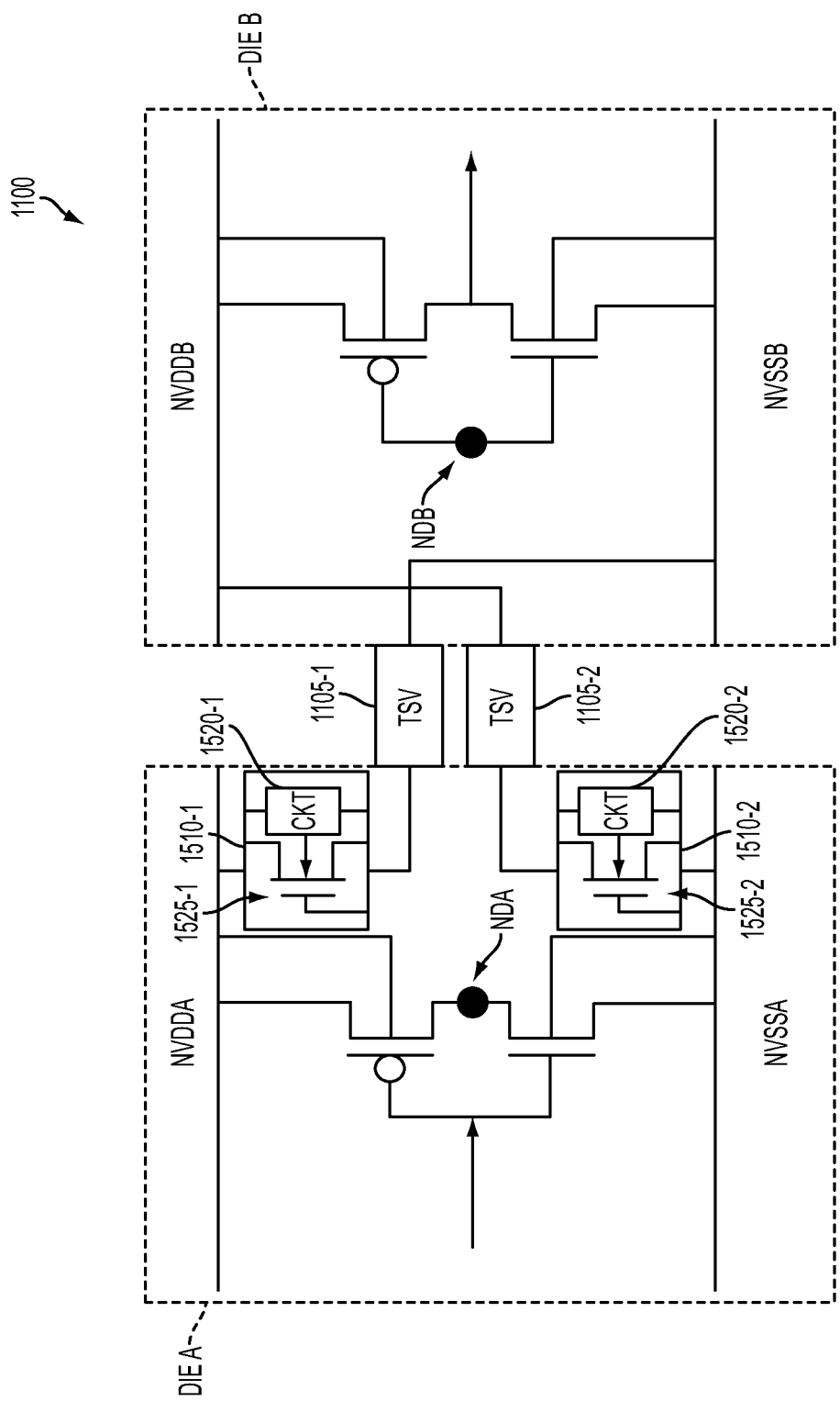
FIG. 15 is a diagram of the circuit in FIG. 11 having protection circuits implemented as NMOS transistors with another control circuit, in accordance with some embodiments.

FIG. 15 is a diagram of chip 1100 in which circuits 1110-1 and 1110-2 are implemented with circuits 1510-1 and 1510-2, respectively, in accordance with some embodiments.

Circuit 1510-1 includes an NMOS transistor 1525-1 having a bulk coupled to control circuit 1520-1 to turn on and off transistor 1525-1.

When transistor 1525-1 is off, transistor 1525-1 is electrically disconnected from node NVDDA. As a result, there is no leakage through transistor 1525-1. When transistor 1525-1 is on, however, transistor 1525-1 functions in a manner similar to NMOS transistor 1210-1. That is, NMOS transistor 1525-1 provides a first current path from node NVDDA, transistor 1525-1, and TSV 1105-1 to node NVSSB. Transistor 1525-1 also provides a second current path from node NVSSB, TSV 1105-1, and transistor 1525-1 to node NVDDA.

In various embodiments, in a normal operation of chip 1100, control circuit 1520-1 is configured to turn off transistor 1525-1. When an ESD event occurs, the ESD current and/or ESD voltage causes control circuit 1520-1 to turn on transistor 1525-1. In some embodiments, control circuit 1520-1 includes mechanisms known in the art to turn on and off transistor 1525-1 based on an ESD event. The mechanisms are not described in this document, but should be recognizable by persons of ordinary skill in the art.

Circuit 1510-2 includes an NMOS transistor 1525-2 having a bulk coupled to control circuit 1520-2 to turn on and off transistor 1525-2.

When transistor 1525-2 is off, transistor 1525-2 is electrically disconnected from node NVSSA. As a result, there is no leakage through transistor 1525-2. When transistor 1525-2 is on, however, transistor 1525-2 functions in a manner similar to NMOS transistor 1210-2. That is, NMOS transistor 1525-2 provides a first current path from node NVSSA, transistor 1525-2, and TSV 1105-2 to node NVDDB. Transistor 1525-2 also provides a second current path from node NVDDB, TSV 1105-2, and transistor 1525-2 to node NVSSA.

In various embodiments, in a normal operation of chip 1100, control circuit 1520-2 is configured to turn off transistor 1525-2. When an ESD event occurs, the ESD current and/or ESD voltage causes control circuit 1520-2 to turn on transistor 1525-2. In some embodiments, control circuit 1520-2 includes mechanisms known in the art to turn on and off transistor 1525-2 based on an ESD event. The mechanisms are not described in this document, but should be recognizable by persons of ordinary skill in the art.

In some embodiments, the mechanisms used in control circuits 1520 and 1420 are also used in circuits to turn on and off transistors 310-1 and 310-2 in FIG. 3, transistors 810-1 and 810-2 in FIG. 8, and transistors 1310-1 and 1310-2 in FIG. 13.

Embodiments of the disclosure are advantageous because protection circuits provide currents path for the ESD current to flow when an ESD event occurs. The chance for the ESD current to flow through other transistors in die A and die B is reduced. As a result, transistors in die A and die B are protected. For example, the ESD current may flow from node NDB through circuit 110-1 in FIG. 1 to node NVDDB, leaving little current to flow through the gate oxide of transistor NB. Effectively, the gate oxide of transistor NB and thus transistor NB are protected. Further, various protection circuits, such as PMOS transistors and NMOS transistors, are turned off during a normal operation of the chips. As a result, the protection circuits do not assert leakage current during the normal operation. Additionally, embodiments advantageously yield improvements in the 2.5D/3D integration process that comprises stacking two individual dies into one single chip. By nature of the individual die, each die may have a different type of electrical charge, resulting in a charge imbalance between the two dies. For example, during the 2.5/3D stacking process the substrate of a first die may have a positive charge and the substrate of a second die may have a negative charge or vice versa. As a result, an imbalance in the charge distribution may occur and cause an ESD event. Without the protection circuits, the ESD current from the ESD event can damage circuit elements in die A and/or die B, and thus lower the manufacturing yield for a chip. The protection circuits prevent the ESD current from damaging die A and or die B, and thus improve the manufacturing yield. Effectively, the ESD protection circuits serve as yield control circuits in the 2.5D/3D integration process.

In some embodiments, an ESD protection circuit is connected to at least one end of a corresponding TSV. For example, with reference to FIG. 1, a first end of TSV 105 on the die B side is coupled to a protection circuit 110-1 and/or 110-2. Alternatively or additionally, a second end of TSV 105 on the die A side is coupled to a protection circuit (not shown) in die A corresponding to circuit 110-1 and/or 110-2 in die B. With reference to FIG. 6, a first end of TSV 605-1 on the die B side is coupled to protection circuit 610-1. Alternatively and/or additionally, a second end of TSV 605-1 on the die A side is coupled to a protection circuit (not shown) in die A corresponding to circuit 610-1 in die B, etc.

Exemplary Method

Figure 16:
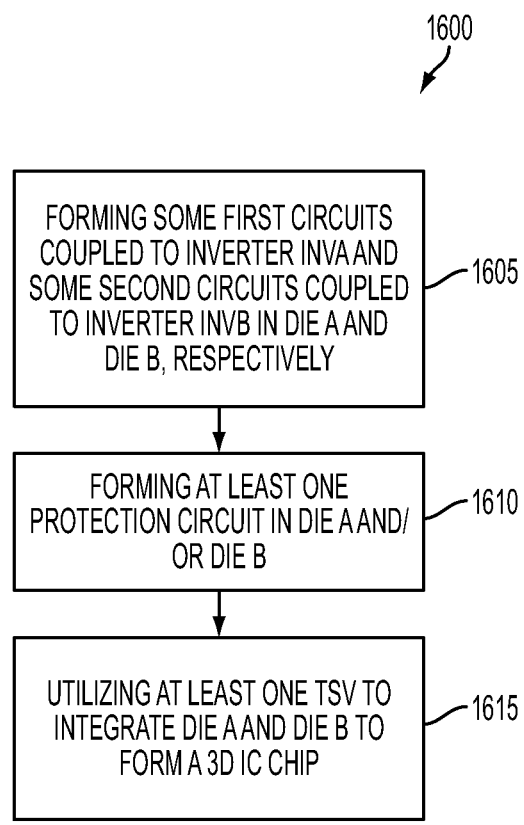
FIG. 16 is a flowchart illustrating a method of forming a 3D IC chip, in accordance with some embodiments.

FIG. 16 is a flowchart of a method 1600 illustrating forming a 3D IC chip, in accordance with some embodiments.

In step 1605, some first circuits coupled to the input of inverter INVA and some second circuits coupled to the output of inverter INVB are formed in die A and die B, respectively.

In step 1610, at least one protection circuit is formed in die A and/or die B. The at least one protection circuit is located at one or a plurality of locations illustratively explained above with reference to FIG. 1 to FIG. 15. A protection circuit is implemented by different circuit elements as explained above with reference to FIG. 1 to FIG. 15 as would be recognizable by persons of ordinary skill in the art after reviewing this document.

In step 1615, at least one TSV connect is used to integrate die A and die B to form a 3D IC chip, such as the 3D IC chips shown in FIGS. 1-15. In some embodiments, the TSVs are formed after the protection circuits are embedded in die A and/or die B in step 1610. The at least one TSV connects different nodes in die A and die B. For example, a first TSV connects node NDA and node NDB as illustratively shown in FIG. 1. A second TSV connects node NVDDA and node NVDDB, and a third TSV connects node NVSSA and NVSSB, as illustratively, shown in FIG. 6. A fourth TSV connects node NVDDA and node NVSSB, and a fifth TSV connects node NVSSA and node NVDDB, as illustratively shown in FIG. 12, etc.

Step 1615 indicating connections between die A and die B is for illustration. Different connections are within the scope of various embodiments as would be recognizable by persons of ordinary skill in the art after reviewing this document.

A number of embodiments have been described. It will nevertheless be understood that various modifications may be made without departing from the spirit and scope of the disclosure. For example, the various transistors being shown as a particular dopant type (e.g., N-type or P-type Metal Oxide Semiconductor (NMOS or PMOS)) are for illustration purposes. Embodiments of the disclosure are not limited to a particular type. Selecting different dopant types for a particular transistor is within the scope of various embodiments. The low or high logic level (e.g., Low or High) of the various signals used in the above description is also for illustration purposes. Various embodiments are not limited to a particular level when a signal is activated and/or deactivated. Selecting different levels is within the scope of various embodiments.

In some embodiment, a chip comprises a first circuit, a second circuit, a first interconnect, and at least one protection circuit. The first circuit has a first node, a first operational voltage node, and a first reference voltage node. The second circuit has a second node, a second operational voltage node, and a second reference voltage node. The first interconnect is configured to electrically connect the first node and the second node to form a 2.5D or a 3D integrated circuit. The at least one protection circuit is located at one or a combination of the following locations. A first location is between the first operational voltage node and the first node. A second location is between the first node and the first reference voltage node. A third location is between the second operational voltage node and the second node. A fourth location is between the second node and the second reference voltage node. A fifth location is between the first operational voltage node and a second interconnect that is coupled to the second operational voltage node. A sixth location is between the second operational voltage node and a third interconnect that is coupled to the first operational node. A seventh location is between the first reference voltage node and a fourth interconnect that is coupled to the second reference voltage node. An eight location is between the second reference voltage node and a fifth interconnect that is coupled to the first reference voltage node. A ninth location is between the first operational voltage node and a sixth interconnect that is coupled to the second reference voltage node. A tenth location is between the second reference voltage node and a seventh interconnect that is coupled to the first operational voltage node. An eleventh location is between the first reference voltage node and an eighth interconnect that is coupled to the second operational voltage node. A twelfth location is between the second operational voltage node and a ninth interconnect that is coupled to the first reference voltage node.

In some embodiments, a chip comprises a first circuit, a second circuit, a through silicon via, a first protection circuit. The first circuit has a first node, a first operational voltage node, and a first reference voltage node. The second circuit has a second node, a second operational voltage node, and a second reference voltage node. The through silicon via is configured to couple the first node and the second node. The first protection circuit is coupled to the first node and the first operational voltage node or the second node and the second operational voltage node. The second protection circuit is coupled to the first node and the first reference voltage node or the second node and the second reference voltage node.

In some embodiments, a first circuit is formed in a first die, resulting in a first node, a first operational voltage node, and a first reference voltage node. A second circuit is formed in a second die, resulting in a second node, a second operational voltage node, and a second reference voltage node. At least one protection circuit is formed in at least one of the first die and the second die. At least one through-silicon via is formed to connect the first die and the second die. The first die is a first individual die or in a first wafer. The second die is a second individual die or in a second wafer. At least one of the following conditions is met. A first protection circuit of the at least one protection circuit is between the first node and the first operational voltage node. A second protection circuit of the at least one protection circuit is between the first node and the first reference voltage node. A third protection circuit of the at least one protection circuit is between the second node and the second operational voltage node. A fourth protection circuit of the at least one protection circuit is between the second node and the second reference voltage node. A first through silicon via of the at least one through silicon via is between the first node and the second node. A second through-silicon via of the at least one through silicon via and a fifth protection circuit are between the first operational voltage node and the second operational voltage node. A third through silicon via of the at least one silicon via and a sixth protection circuit are between the first reference voltage node and the second reference voltage node. A fourth through silicon via of the at least one through-silicon via and a seventh protection circuit are between the first operational voltage node and the second reference voltage node. A fifth through silicon via of the at least one through silicon via and an eighth protection circuit are between the first reference voltage node and the second operational voltage node.

The above methods show exemplary steps, but the steps are not necessarily performed in the order shown. Steps may be added, replaced, changed order, and/or eliminated as appropriate, in accordance with the spirit and scope of disclosed embodiments.

What is claimed is:

1. A chip comprising:
   a first circuit having a first node, a first operational voltage node, and a first reference voltage node;
   a second circuit having a second node, a second operational voltage node, and a second reference voltage node;
   a first interconnect configured to electrically connect the first node and the second node to form a 2.5D or a 3D integrated circuit;
   at least one protection circuit located at one or a combination of the following locations
      a first location between the first operational voltage node and the first node;
      a second location between the first node and the first reference voltage node;
      a third location between the second operational voltage node and the second node;
      a fourth location between the second node and the second reference voltage node;
      a fifth location between the first operational voltage node and a second interconnect that is coupled to the second operational voltage node;
      a sixth location between the second operational voltage node and a third interconnect that is coupled to the first operational node;
      a seventh location between the first reference voltage node and a fourth interconnect that is coupled to the second reference voltage node;
      an eight location between the second reference voltage node and a fifth interconnect that is coupled to the first reference voltage node;
      a ninth location between the first operational voltage node and a sixth interconnect that is coupled to the second reference voltage node;
      a tenth location between the second reference voltage node and a seventh interconnect that is coupled to the first operational voltage node;
      an eleventh location between the first reference voltage node and an eighth interconnect that is coupled to the second operational voltage node; and
      a twelfth location between the second operational voltage node and a ninth interconnect that is coupled to the first reference voltage node.

2. The chip of claim 1, wherein the at least one protection circuit includes a device selected from a group consisting of a diode, a metal oxide semiconductor (MOS) transistor, a silicon controlled rectifier, and a bipolar junction transistor.

3. The chip of claim 1, wherein
   the at least one protection circuit includes at least one diode;
   an anode of a first diode of the at least one diode is coupled to the first node, and a cathode of the first diode is coupled to the first operational voltage node, if the first diode of the at least one diode is located at the first location;
   an anode of a second diode of the at least one diode coupled to the first reference voltage node, and a cathode of the second diode is coupled to the first node, if the second diode of the at least one diode is located at the second location;
   an anode of a third diode of the at least one diode is coupled to the second node, and a cathode of the third diode is coupled to the second operational voltage node, if the third diode is located at the third location; and
   an anode of a fourth diode of the at least one diode is coupled to the second reference voltage node, and a cathode of the fourth diode is coupled to the second node, if the fourth diode is located at the fourth location.

4. The chip of claim 1, wherein
   the at least one protection circuit includes at least one P-type metal oxide semiconductor (PMOS) transistor and/or at least one N-type metal oxide semiconductor (NMOS) transistor;
   a source of a first PMOS transistor of the at least one PMOS transistor is coupled to a gate of the first PMOS transistor and to the first operational voltage node, and a drain of the first PMOS transistor is coupled to the first node, if the first PMOS transistor of the at least one PMOS transistor is located at the first location;
   a source of a second PMOS transistor of the at least one PMOS transistor is coupled to a gate of the second PMOS transistor and to the second operational voltage node, and the drain of the second PMOS transistor is coupled to the second node, if the second PMOS transistor of the at least one PMOS transistor is located at the third location;
   a source of a first NMOS transistor of the at least one NMOS transistor is coupled to a gate of the first NMOS transistor and to the first reference voltage node, and a drain of the fist NMOS transistor is coupled to the first node, if the first NMOS transistor of the at least one NMOS transistor is located at the second location; and
   a source of a second NMOS transistor of the at least one NMOS transistor is coupled to a gate of the second NMOS transistor and to the second reference voltage node, and a drain of the second NMOS transistor is coupled to the second node, if the second NMOS transistor of the at least one NMOS transistor is located at the fourth location.

5. The chip of claim 4, further comprising at least one control circuit configured to satisfy at least one of the following conditions:
   a first control circuit of the at least one control circuit is configured to control the gate of the first PMOS transistor;
   a second control circuit of the at least one control circuit is configured to control the gate of the second PMOS transistor;
   a third control circuit of the at least one control circuit is configured to control the gate of the first NMOS transistor;
   a fourth control circuit of the at least one control circuit is configured to control the gate of the second NMOS transistor;
   a fifth control circuit of the at least one control circuit is configured to control a bulk of the first PMOS transistor;
   a sixth control circuit of the at least one control circuit is configured to control a bulk of the second PMOS transistor;
   a seventh control circuit of the at least one control circuit is configured to control a bulk of the first NMOS transistor; and
   an eight control circuit of the at least one control circuit is configured to control a bulk of the second NMOS transistor.

6. The chip of claim 1, wherein
   the at least one protection circuit includes at least one silicon controlled rectifier (SCR);
   an anode of a first SCR of the at least one SCR is coupled to the first operational voltage node, and a cathode of the first SCR is coupled to the first node, if the first SCR of the at least one SCR is located at the first location;

an anode of a second SCR of the at least one SCR is coupled to the first node, and a cathode of the second SCR is coupled to the first reference voltage node, if the second SCR of the at least one SCR is located at the second location;

an anode of a third SCR of the at least one SCR is coupled to the second operational voltage node, and a cathode of the third SCR is coupled to the second node, if the third SCR of the at least one SCR is located at the third location; and an anode of a fourth SCR of the at least one SCR is coupled to the second node, and a cathode of the fourth SCR is coupled to the second reference voltage node, if the fourth SCR of the at least one SCR is located at the fourth location.

7. The chip of claim 1, wherein the at least one protection circuit includes at least one P-doped N-doped P-doped (PNP) bipolar transistor and/or at least one N-doped P-doped N-doped (NPN) bipolar transistor;

an emitter of a first PNP bipolar transistor of the at least one PNP bipolar transistor and the base of the first PNP bipolar transistor are coupled to the first operational voltage node, and a collector of the first PNP bipolar transistor is coupled to the first node, if the first PNP bipolar transistor of the at least one PNP transistor is located at the first location;

an emitter of a second PNP bipolar transistor of the at least one PNP bipolar transistor and a base of the second PNP bipolar transistor are coupled to the second operational voltage node, and a collector the second PNP bipolar transistor are coupled to the second node, if the second PNP bipolar transistor of the at least one PNP transistor is located at the third location;

an emitter and a base of a first NPN bipolar transistor of the at least one NPN bipolar transistor are coupled to the first reference voltage node, and a collector of the first NPN bipolar transistor is coupled to the first node, if the first NPN bipolar transistor of the at least one NPN transistor is located at the second location; and an emitter and a base of a second NPN bipolar transistor of the at least one NPN bipolar transistor are coupled to the second reference voltage node, and a collector of the second NPN bipolar transistor is coupled to the second node, if the second NPN bipolar transistor of the at least one NPN transistor is located at the fourth location.

8. The chip of claim 1, wherein the at least one protection circuit includes at least one pair of diodes, each pair of diodes of the at least one pair of diodes having a first diode, a second diode, a first pair node, and a second pair node, the first pair node coupling a first anode of the first diode and a second cathode of the second diode, the second pair node coupling a first cathode of the first diode and a second anode of the second diode;

a first pair node of a first pair of diodes of the at least one pair of diodes is coupled to the first operational voltage node and a second pair node of the first pair of diodes is coupled to the second interconnect, if the first pair of diodes of the at least one pair of diodes is located at the fifth location;

a first pair node of a second pair of diodes of the at least one pair of diodes is coupled to the second operational voltage node and a second pair node of the second pair of diodes is coupled to the third interconnect, if the second pair of diodes of the at least one pair of diodes is located at the sixth location;

a first pair node of a third pair of diodes of the at least one pair of diodes is coupled to the first reference voltage node and a second pair node of the third pair of diodes is coupled to the fourth interconnect, if the third pair of diodes of the at least one pair of diodes is located at the seventh location; and a first pair node of a fourth pair of diodes of the at least one pair of diodes is coupled to the second reference voltage node and a second pair node of the fourth pair of diodes is coupled to the fifth interconnect, if the fourth pair of diodes of the at least one pair of diodes is located at the eighth location.

9. The chip of claim 1, wherein the at least one protection circuit includes at least one PMOS transistor and/or at least one NMOS transistor, each PMOS transistor of the at least one PMOS transistor has a drain as a first P end and a source coupled to a gate as a second P end, each NMOS transistor of the at least one NMOS transistor has a drain as a first N end and a source coupled to a gate as a second N end;

a first PMOS transistor of the at least one PMOS transistor is coupled between the first operational voltage node and the second interconnect via a first P end and a second P end of the first PMOS transistor, if the first PMOS transistor of the at least one PMOS transistor is located at the fifth location;

a second PMOS transistor of the at least one PMOS is coupled between the second operational voltage node and the third interconnect via a first P end and a second P end of the second PMOS transistor, if the second PMOS transistor of the at least one PMOS transistor is located at the sixth location;

a first NMOS transistor of the at least one NMOS is coupled between the first reference voltage node and the fourth interconnect via a first N end and a second N end of the first NMOS transistor, if the first NMOS transistor of the at least one NMOS transistor is located at the seventh location; and a second NMOS transistor of the at least one NMOS is coupled between the second reference voltage node and the fifth interconnect via a first N end and a second N end of the second NMOS transistor, if the second NMOS transistor of the at least one NMOS transistor is located at the eighth location.

10. The chip of claim 9, further comprising at least one control circuit configured to satisfy at least one of the following conditions:

a first control circuit of the at least one control circuit is configured to control a gate of the first PMOS transistor;

a second control circuit of the at least one control circuit is configured to control a gate of the second PMOS transistor;

a third control circuit of the at least one control circuit is configured to control a gate of the first NMOS transistor;

a fourth control circuit of the at least one control circuit is configured to control a gate of the second NMOS transistor;

a fifth control circuit of the at least one control circuit is configured to control a bulk of the first PMOS transistor;

a sixth control circuit of the at least one control circuit is configured to control a bulk of the second PMOS transistor;

a seventh control circuit of the at least one control circuit is configured to control a bulk of the first NMOS transistor; and an eight control circuit of the at least one control circuit is configured to control a bulk of the second NMOS transistor.

11. The chip of claim 1, wherein
the at least one protection circuit includes at least one silicon controlled rectifier (SCR), each SCR of the at least one SRC including an anode and a cathode;
a first SCR of the at least one SCR is coupled between the first operational node and the second interconnect via a first anode and a first cathode of the first SCR, if the first SCR of the at least one SCR is located at the fifth location;
a second SCR of the at least one SCR is coupled between the second operational node and the third interconnect via a second anode and a second cathode of the second SCR, if the second SCR of the at least one SCR is located at the sixth location;
a third SCR of the at least one SCR is coupled between the first reference node and the fourth interconnect via a third anode and a third cathode of the third SCR, if the third SCR of the at least one SCR is located at the seventh location; and
a fourth SCR of the at least one SCR is coupled between the second reference node and the fifth interconnect via a fourth anode and a fourth cathode of the fourth SCR, if the fourth SCR of the at least one SCR is located at the eight location.

12. The chip of claim 1, wherein
the at least one protection circuit includes at least one PNP bipolar transistor and/or at least one NPN bipolar transistor, each PNP bipolar transistor of the at least one PNP bipolar transistor having an emitter coupled to a base and configured as a first PNP end and a collector configured as a second PNP end, each NPN bipolar transistor of the at least one NPN bipolar transistor having an emitter coupled to a base and configured as a first NPN end and a collector configured as a second NPN end;
a first PNP bipolar transistor of the at least one PNP bipolar transistor is coupled between the first operational voltage node and the second interconnect via a first PNP end and a second PNP end of the first PNP bipolar transistor, if the first PNP bipolar transistor of the at least one PNP bipolar transistor is located at the fifth location;
a second PNP bipolar transistor of the at least one PNP bipolar transistor is coupled between the second operational voltage node and the third interconnect via a first PNP end and a second PNP end of the second PNP bipolar transistor, if the second PNP bipolar transistor of the at least one PNP bipolar transistor is located at the sixth location;
a first NPN bipolar transistor of the at least one NPN bipolar transistor is coupled between the first reference voltage node and the fourth interconnect via a first NPN end and a second NPN end of the first NPN bipolar transistor, if the first NPN bipolar transistor of the at least one NPN bipolar transistor is located at the seventh location; and
a second NPN bipolar transistor of the at least one NPN bipolar transistor is coupled between the second reference voltage node and the fifth interconnect via a first NPN end and a second NPN end of the second NPN bipolar transistor, if the second NPN bipolar transistor of the at least one NPN bipolar transistor is located at the eighth location.

13. The chip of claim 1, wherein
the at least one protection circuit includes at least one NMOS transistor and/or at least one PMOS transistor;
a first N drain of a first NMOS transistor of the at least one NMOS transistor is coupled to the first operational voltage node, a first N source and a first N gate of the first NMOS transistor are coupled to the sixth interconnect, if the first NMOS transistor of the at least one NMOS transistor is located at the ninth location;
a second N drain of a second NMOS transistor of the at least one NMOS transistor is coupled to the seventh interconnect, a second N source and a second N gate of the second NMOS transistor are coupled to the second reference voltage node, if the second NMOS transistor of the at least one NMOS transistor is located at the tenth location;
a third N drain of a third NMOS transistor of the at least one NMOS transistor is coupled to the eighth interconnect, a third N source and a third N gate of the third NMOS transistor are coupled to the first reference voltage node, if the third NMOS transistor of the at least one NMOS transistor is located at the eleventh location;
a fourth N drain of a fourth NMOS transistor of the at least one NMOS transistor is coupled to the second operational voltage node, a fourth N source and a fourth N gate of the fourth NMOS transistor are coupled to the ninth interconnect, if the fourth NMOS transistor of the at least one NMOS transistor is located at the twelfth location;
a first P drain of a first PMOS transistor of the at least one PMOS transistor is coupled to the sixth interconnect, a first P source and a first P gate of the first PMOS transistor are coupled to the first operational voltage node, if the first PMOS transistor of the at least one PMOS transistor is located at the ninth location;
a second P drain of a second PMOS transistor of the at least one PMOS transistor is coupled to the second reference voltage node, a second P source and a second P gate of the second PMOS transistor are coupled to the seventh interconnect, if the second PMOS transistor of the at least one PMOS transistor is located at the tenth location;
a third P drain of a third PMOS transistor of the at least one PMOS transistor is coupled to the first reference voltage node, a third P source and a third P gate of the third PMOS transistor are coupled to the eighth interconnect, if the third PMOS transistor of the at least one PMOS transistor is located at the eleventh location; and
a fourth P drain of a fourth PMOS transistor of the at least one PMOS transistor is coupled to the ninth interconnect, a fourth P source and a fourth P gate of the fourth PMOS transistor are coupled to the second operational voltage node, if the fourth PMOS transistor of the at least one PMOS transistor is located at the twelfth location.

14. The chip of claim 13, wherein the chip further comprises at least one control circuit configured to satisfy at least one of the following conditions:
a first control circuit of the of the at least one control circuit is configured to control the first N gate of the first NMOS transistor;
a second control circuit of the of the at least one control circuit is configured to control the second N gate of the second NMOS transistor;
a third control circuit of the of the at least one control circuit is configured to control the third N gate of the third NMOS transistor;
a fourth control circuit of the of the at least one control circuit is configured to control the fourth N gate of the fourth NMOS transistor;

a fifth control circuit of the of the at least one control circuit is configured to control a first N bulk of the first NMOS transistor;

a sixth control circuit of the of the at least one control circuit is configured to control a second N bulk of the second NMOS transistor;

a seventh control circuit of the of the at least one control circuit is configured to control a third N bulk of the third NMOS transistor;

an eight control circuit of the of the at least one control circuit is configured to control a fourth N bulk of the fourth NMOS transistor;

a ninth control circuit of the of the at least one control circuit is configured to control the first P gate of the first PMOS transistor;

a tenth control circuit of the of the at least one control circuit is configured to control the second P gate of the second PMOS transistor;

an eleventh control circuit of the of the at least one control circuit is configured to control the third P gate of the third PMOS transistor;

a twelfth control circuit of the of the at least one control circuit is configured to control the fourth P gate of the fourth PMOS transistor;

a thirteenth control circuit of the of the at least one control circuit is configured to control a first P bulk of the first PMOS transistor;

a fourteenth control circuit of the of the at least one control circuit is configured to control a second P bulk of the second PMOS transistor;

a fifteenth control circuit of the of the at least one control circuit is configured to control a third P bulk of the third PMOS transistor; and a sixteenth control circuit of the of the at least one control circuit is configured to control a fourth P bulk of the fourth PMOS transistor.

15. The chip of claim 1, wherein
the first node is an output of a first inverter in the first circuit; and
the second node is an input of a second inverter in the second circuit.

16. A chip comprising:
a first circuit having a first node, a first operational voltage node, and a first reference voltage node;
a second circuit having a second node, a second operational voltage node, and a second reference voltage node;
a through-silicon via configured to couple the first node and the second node;
a first protection circuit; and
a second protection circuit,
wherein
the first protection circuit is coupled to the first node and the first operational voltage node or the second node and the second operational voltage node; and
the second protection circuit is coupled to the first node and the first reference voltage node or the second node and the second reference voltage node.

17. The chip of claim 16, wherein
the first node is an output node of the first circuit; and
the second node is an input node of the second circuit.

18. A method comprising:
forming a first circuit in a first die, resulting in a first node, a first operational voltage node, and a first reference voltage node;
forming a second circuit in a second die, resulting in a second node, a second operational voltage node, and a second reference voltage node;
forming at least one protection circuit in at least one of the first die and the second die; and
forming a first through-silicon via of at least one through-silicon via to electrically connect the first node and the second node,
wherein
the first die is a first individual die or is in a first wafer;
the second die is a second individual die or is in a second wafer; and
at least one of the following conditions is met
a first protection circuit of the at least one protection circuit is between the first node and the first operational voltage node;
a second protection circuit of the at least one protection circuit is between the first node and the first reference voltage node;
a third protection circuit of the at least one protection circuit is between the second node and the second operational voltage node;
a fourth protection circuit of the at least one protection circuit is between the second node and the second reference voltage node;
a second through-silicon via and a fifth protection circuit are between the first operational voltage node and the second operational voltage node;
a third through-silicon via and a sixth protection circuit are between the first reference voltage node and the second reference voltage node;
a fourth through-silicon via and a seventh protection circuit are between the first operational voltage node and the second reference voltage node; and
a fifth through-silicon via and an eighth protection circuit are between the first reference voltage node and the second operational voltage node.

19. The method of claim 18, wherein forming the at least one protection circuit in at least one of the first die and the second die is before forming the at least one through-silicon via to connect the first die and the second die.

20. The method of claim 18, wherein
the first circuit includes a first inverter;
the first node is an output node of the first inverter;
the second circuit includes a second inverter; and
the second node is an input of the second inverter.

* * * * *